US012805074B2

(12) United States Patent
An et al.

(10) Patent No.: US 12,805,074 B2
(45) Date of Patent: Nov. 17, 2026

(54) DISPLAY DEVICE

(71) Applicant: LG Display Co., Ltd., Seoul (KR)

(72) Inventors: Sumin An, Daegu (KR); Youngchul Shin, Daegu (KR); Young Cheol Chae, Paju-si (KR); Changwook Song, Busan (KR); JiSub Park, Gumi-si (KR); Byeonggon Kim, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 431 days.

(21) Appl. No.: 18/480,858

(22) Filed: Oct. 4, 2023

(65) Prior Publication Data

US 2024/0204145 A1 Jun. 20, 2024

(30) Foreign Application Priority Data

Dec. 13, 2022 (KR) ........................ 10-2022-0173704

(51) Int. Cl.

*H10H 20/84* (2025.01)
*H10H 20/852* (2025.01)
*H10H 20/855* (2025.01)
*H10W 90/00* (2026.01)

(52) U.S. Cl.

CPC .......... *H10H 20/84* (2025.01); *H10H 20/852* (2025.01); *H10H 20/855* (2025.01); *H10W 90/00* (2026.01)

(58) Field of Classification Search

CPC .... H10H 20/84; H10H 20/852; H10H 20/855; H10W 90/00; H10K 59/80518; H10K 59/1213; H10K 59/122; H10K 59/40; H10K 59/879; H10K 50/813; H10K 50/8426; H10K 50/844; H10K 50/865; H10K 59/124

See application file for complete search history.

(56) References Cited

U.S. PATENT DOCUMENTS

| | | | | |
|---|---|---|---|---|
| 2021/0135166 A1* | 5/2021 | Baek | ..................... | G06F 3/0412 |
| 2022/0199715 A1* | 6/2022 | Kim | ....................... | H10K 59/38 |

FOREIGN PATENT DOCUMENTS

| | | |
|---|---|---|
| KR | 10-2015-0136798 A | 12/2015 |
| KR | 10-2017-0124031 A | 11/2017 |
| KR | 10-2019-0009875 A | 1/2019 |
| KR | 10-2021-0017366 A | 2/2021 |
| KR | 10-2021-0045658 A | 4/2021 |
| KR | 10-2021-0054830 A | 5/2021 |
| KR | 10-2022-0033770 A | 3/2022 |
| KR | 10-2022-0048884 A | 4/2022 |

* cited by examiner

*Primary Examiner* — Elmito Breval

(74) *Attorney, Agent, or Firm* — Birch, Stewart, Kolasch & Birch, LLP

(57) ABSTRACT

A display device can include a substrate divided into a plurality of sub pixels each including an emission area, a planarization layer disposed on the substrate and including a concave portion with the emission area, an anode including the concave portion to be disposed on the planarization layer, a light emitting unit disposed on the anode of the emission area, a bank disposed on the anode and the planarization layer excluding the emission area, a cathode disposed on the light emitting unit and the planarization layer, an encapsulation unit disposed on the cathode, a lens disposed on the encapsulation unit corresponding to the emission area, a planarization layer disposed on the lens, and a first light shielding layer disposed on the planarization layer.

22 Claims, 17 Drawing Sheets

DISPLAY DEVICE

CROSS-REFERENCE TO RELATED APPLICATIONS

This application claims priority to Korean Patent Application No. 10-2022-0173704 filed on Dec. 13, 2022, in the Korean Intellectual Property Office, the entire disclosure of which is hereby expressly incorporated by reference into the present application.

BACKGROUND OF THE DISCLOSURE

Field

The present disclosure relates to a display device, and more particularly, to a display device which improves a light extraction efficiency.

Discussion of the Related Art

Currently, as our society enters a full-scale information era, the field of a display device which visually expresses electrical information signals has been rapidly developed and studies are continued to improve the performance of various display devices such as a thin-thickness, a light weight, and low power consumption.

Among the various display devices, an electroluminescent display device is a self-emitting display device that the does not require a separate light source, which is different from a liquid crystal display device. Therefore, the light emitting display device can be manufactured to have a light weight and a small thickness.

Further, since the electroluminescent display device is driven at a low voltage so that it is advantageous not only in terms of power consumption, but also in terms of color implementation, a response speed, a viewing angle, a contrast ratio (CR). Therefore, it is expected to be utilized in various fields.

In the meantime, light emitted from an emission layer of the electroluminescent display device passes through various components of the electroluminescent display device to be released to the outside of the electroluminescent display device. However, some of the light emitted from the emission layer can be trapped in the electroluminescent display device without being released to the outside of the electroluminescent display device so that the light extraction efficiency of the electroluminescent display device can be an issue.

SUMMARY OF THE DISCLOSURE

An object to be achieved by the present disclosure is to provide a display device which improves a luminous efficiency and a luminance viewing angle using a side-mirror shaped anode and a convex spherical lens.

Another object to be achieved by the present disclosure is to provide a display device which suppresses a damage of a light emitting diode which can be caused by external ultraviolent (UV) rays (UV light).

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device can include a substrate divided into a plurality of sub pixels each including an emission area, a planarization layer disposed on the substrate and including a concave portion having the emission area, an anode including the concave portion to be disposed on the planarization layer, a light emitting unit disposed on the anode of the emission area, a bank disposed on the anode and the planarization layer excluding the emission area, a cathode disposed on the light emitting unit and the planarization layer, an encapsulation unit disposed on the cathode, a lens disposed on the encapsulation unit corresponding to the emission area; a planarization layer disposed on the lens, and a first light shielding layer disposed on the planarization layer.

According to another aspect of the present disclosure, a display device can include a substrate including an active area having a plurality of sub pixels and a non-active area, a thin film transistor disposed in the active area of the substrate, a light emitting diode disposed in the active area of the substrate to be electrically connected to the thin film transistor and having at least one emission area in one sub pixel, and a lens disposed on the light emitting diode so as to overlap the at least one emission area, where the lens is configured by a center area which covers at least one emission area and a peripheral area which encloses the center area and has a UV shielding layer (UV light shielding layer) disposed to overlap the peripheral area.

Other detailed matters of the exemplary embodiments are included in the detailed description and the drawings.

According to the present disclosure, a side-mirror shaped anode and a convex spherical lens are used to improve a luminous efficiency and a luminance viewing angle of the display device.

According to the present disclosure, a UV shielding layer is added in an upper portion of the encapsulation unit and in an upper portion and a side surface of the side-mirror shaped anode to suppress a damage of a light emitting diode due to the UV rays.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
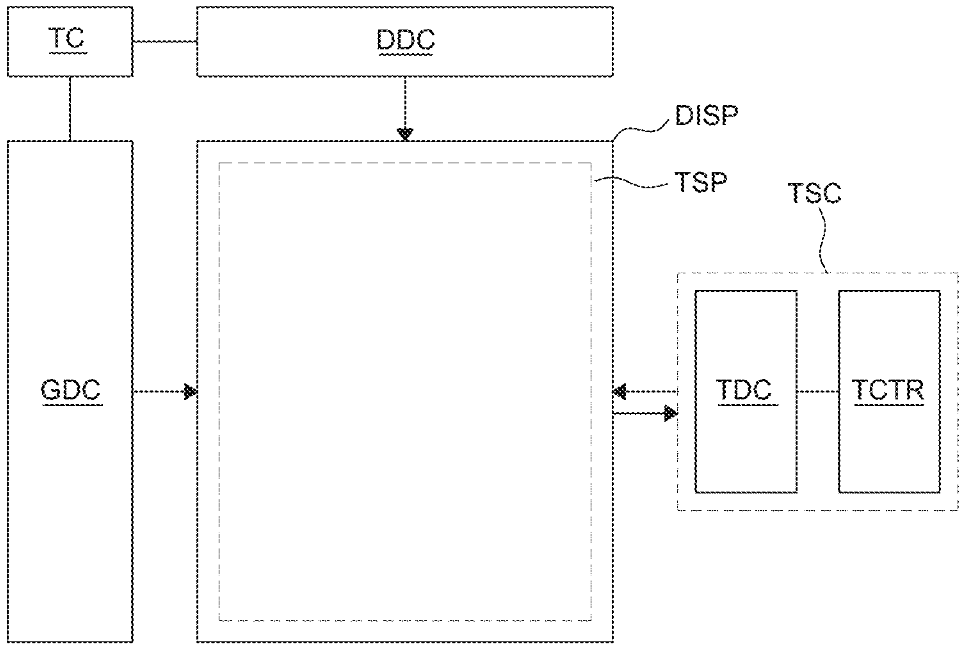
FIG. 1 is a view schematically illustrating a configuration of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," "comprising," etc. used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", "under", "next", etc., one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification. Further, in the specification, if the phrase "UV ray" or "UV light" is not used, the term "UV" means UV ray or UV light.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various detailed exemplary embodiments of the present disclosure will be described with reference to accompanying drawings. All the components of each display device according to all embodiments of the present disclosure are operatively coupled and configured.

FIG. 1 is a view schematically illustrating a configuration of a display device according to an exemplary embodiment of the present disclosure.

For example, FIG. 1 illustrates a schematic configuration of a display device in which a touch panel TSP according to an exemplary embodiment of the present disclosure is embedded. However, the present disclosure is not limited thereto and a display device according to the exemplary embodiment of the present disclosure can also not include a touch panel.

Referring to FIG. 1, the display device according to the exemplary embodiment of the present disclosure can provide both a function for displaying images and a function for sensing a touch.

In order to provide an image displaying function, the display device according to the exemplary embodiment of the present disclosure can include a display panel DISP, a gate driving circuit GDC, a data driving circuit DDC, and a timing controller TC.

For example, in the display panel DISP, a plurality of data lines and a plurality of gate lines are disposed and a plurality of sub pixels defined by the plurality of data lines and the plurality of gate lines can be disposed.

The data driving circuit DDC drives a plurality of data lines and the gate driving circuit GDC drives a plurality of gate lines, and the timing controller TC can control operations of the data driving circuit DDC and the gate driving circuit GDC.

Each of the data driving circuit DDC, the gate driving circuit GDC, and the timing controller TC can also be implemented by one or more individual components. In some cases, two or more of the data driving circuit DDC, the gate driving circuit GDC, and the timing controller TC can be implemented to be combined as one component. For example, the data driving circuit DDC and the timing controller TC can also be implemented as one integrated chip (IC chip).

In order to provide a touch sensing function, the display device according to exemplary embodiment of the present disclosure can include a touch panel TSP and a touch sensing circuit TSC. The touch panel TSP includes a plurality of touch electrodes. The touch sensing circuit TSC supplies a touch driving signal to the touch panel TSP and detects a touch sensing signal from the touch panel TSP to sense the presence of a touch of a user or a touch position (touch coordinate) in the touch panel TSP based on the detected touch sensing signal.

For example, the touch sensing circuit TSC can include a touch driving circuit TDC and a touch controller TCTR. The touch driving circuit TDC supplies a touch driving signal to the touch panel TSP and detects a touch sensing signal from the touch panel TSP. The touch controller TCTR senses the presence of a touch of a user and/or a touch position in the touch panel TSP based on the touch sensing signal detected by the touch driving circuit TDC. The touch driving circuit TDC can include a first circuit part which supplies the touch driving signal to the touch panel TSP and a second circuit part which detects the touch sensing signal from the touch panel TSP.

For example, the touch driving circuit TDC and the touch controller TCTR can be implemented by separate components or in some cases, can also be implemented to be combined as one component.

For example, each of the data driving circuit DDC, the gate driving circuit GDC, and the touch driving circuit TDC can be implemented by one or more integrated circuits. From the viewpoint of electrical connection with the display panel DISP, the circuits can be implemented by a chip on glass (COG) type, a chip on film (COF) type, or a tape carrier package (TCP) type. Further, the gate driving circuit GDC can also be implemented by a gate in panel (GIP) type.

For example, each of circuit configurations DDC, GDC, and TC for display driving and circuit configurations TDC and TCTR for touch sensing can be implemented by one or more individual components. In some cases, one or more of circuit configurations DDC, GDC, and TC for display driving and one or more of circuit configurations TDC and TCTR for touch sensing can also be functionally integrated to be implemented by one or more components.

For example, the data driving circuit DDC and the touch driving circuit TDC can be implemented to be integrated in one or two or more integrated circuit chips. When the data driving circuit DDC and the touch driving circuit TDC are implemented to be integrated in two or more integrated circuit chips, each of two or more integrated circuit chips can have a data driving function and a touch driving function.

In the meantime, the display device according to the exemplary embodiments of the present disclosure can be various types such as a light emitting display device or a liquid crystal display device. Hereinafter, for the convenience of description, a light emitting display device will be described as an example of the display device. For example, even though the display panel DISP can be various types such as a light emitting display panel or a liquid crystal display panel, in the following description, for the convenience of description, a light emitting display panel will be described as an example of the display panel DISP.

Further, as it will be described below, the touch panel TSP can include a plurality of touch electrodes which is applied with a touch driving signal or can detect a touch sensing signal therefrom and a plurality of touch routing lines which connects the plurality of touch electrodes to the touch driving circuit TDC.

The touch panel TSP can also be provided at the outside of the display panel DISP. For example, the touch panel TSP and the display panel DISP can be separately manufactured to be combined. Such a touch panel TSP is called an external type or an add-on type.

In contrast, the touch panel TSP can also be embedded in the display panel DISP. For example, when the display panel DISP is manufactured, a touch sensor structure such as a plurality of touch electrodes and a plurality of touch routing lines which configure a touch panel TSP can be formed together with a plurality of electrodes and signal lines for display driving.

Further, the touch panel TSP can also be formed directly above the encapsulation unit of the display panel DISP. For example, the touch insulating film and the touch electrodes are patterned above the encapsulation unit and the touch panel is connected to signal lines formed as electrodes for display driving to be driven. Hereinafter, for the convenience of description, an example that the touch panel TSP is formed directly above the encapsulation unit will be described.

Figure 2:
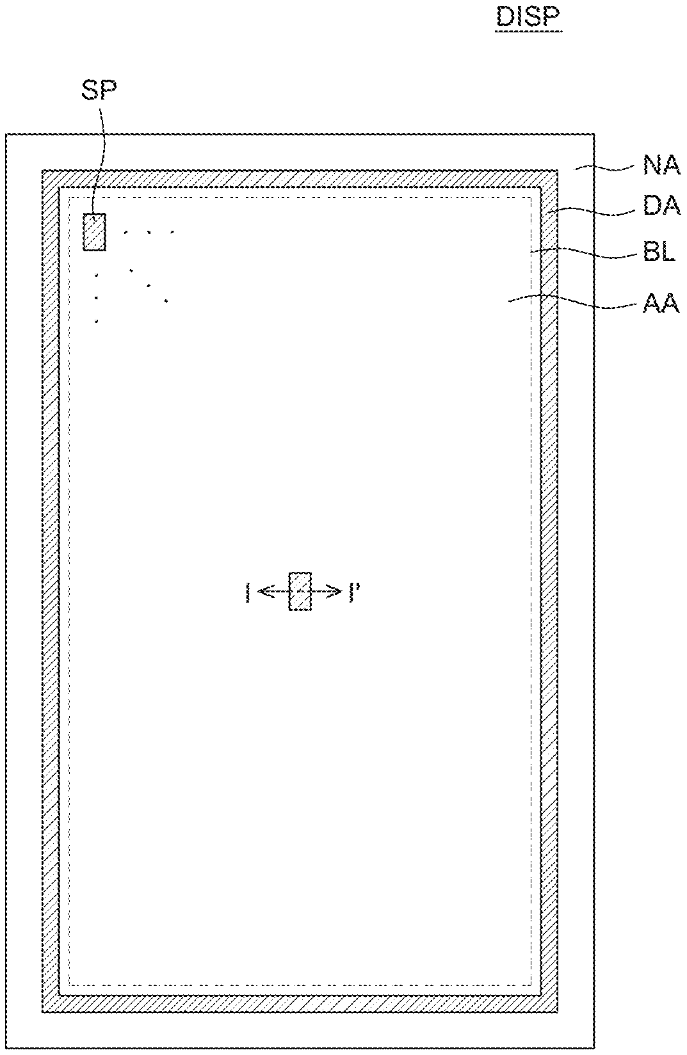
FIG. 2 is a view schematically illustrating a display panel of FIG. 1.

FIG. 2 is a view schematically illustrating the display panel of FIG. 1.

Referring to FIG. 2, the display panel DISP can include an active area AA in which images are displayed and a non-active area NA which is an outer area of an outer boundary line BL of the active area AA.

In the active area AA of the display panel DISP, a plurality of sub pixels SP for displaying images is disposed and various electrodes or signal lines for driving the display panel are disposed.

Further, in the active area AA of the display panel DISP, a plurality of touch electrodes for touch sensing and a plurality of touch routing lines electrically connected thereto can be disposed. Accordingly, the display area AA can also be referred to as a touch sensing area which is capable of sensing the touch.

In the non-active area NA of the display panel DISP, link lines extending from various signal lines disposed in the active area AA or link lines which are electrically connected to various signal lines disposed in the active area AA, and pads which are electrically connected to the link lines can be disposed. The pads disposed in the non-active area NA can be bonded or electrically connected with the display driving circuit.

Further, in the non-active area NA of the display panel DISP, link lines extending from a plurality of touch routing lines disposed in the active area AA or link lines which are electrically connected to a plurality of touch routing lines disposed in the active area AA, and pads which are electrically connected to the link lines can be disposed. The pads disposed in the non-active area NA can be bonded or electrically connected with the touch driving circuit.

In the non-active area NA, a part of an outermost touch electrode, among a plurality of touch electrodes disposed in the active area AA, expands or one or more electrodes (touch electrodes) formed of the same material as the plurality of touch electrodes disposed in the active area AA can also be further disposed.

For example, all the plurality of touch electrodes disposed in the display panel DISP can be disposed in the active area AA or some (for example, an outermost touch electrode) among the plurality of touch electrodes disposed in the display panel DISP can be disposed in the non-active area NA. Some (for example, an outermost touch electrode) among the plurality of touch electrodes disposed in the display panel DISP can also be disposed in both the active area AA and the non-active area NA.

In the meantime, referring to FIG. 2, the display panel DISP according to the exemplary embodiment of the present disclosure can include a dam area DA having a dam for suppressing any layer (for example, the encapsulation unit in the display panel) in the active area AA from passing over the display panel DISP.

The dam area DA can be located at a boundary of the active area AA and the non-active area NA or at any one position of a non-active area NA which is an outer area of the active area AA.

The dam disposed in the dam area DA can be disposed to enclose all directions of the active area AA or disposed only at an outside of one or two or more parts of the active area AA.

The dam disposed in the dam area DA can also have one pattern in which all the dams are connected or two or more separated patterns. Further, in the dam area DA, only a primary dam can be disposed or two or more dams (primary dam and secondary dam) can also be disposed, or three or more dams can also be disposed.

For example, in the dam area DA, in any one direction, only the primary dam is disposed and in the other direction, both the primary dam and the secondary dam can also be disposed.

Figure 3:
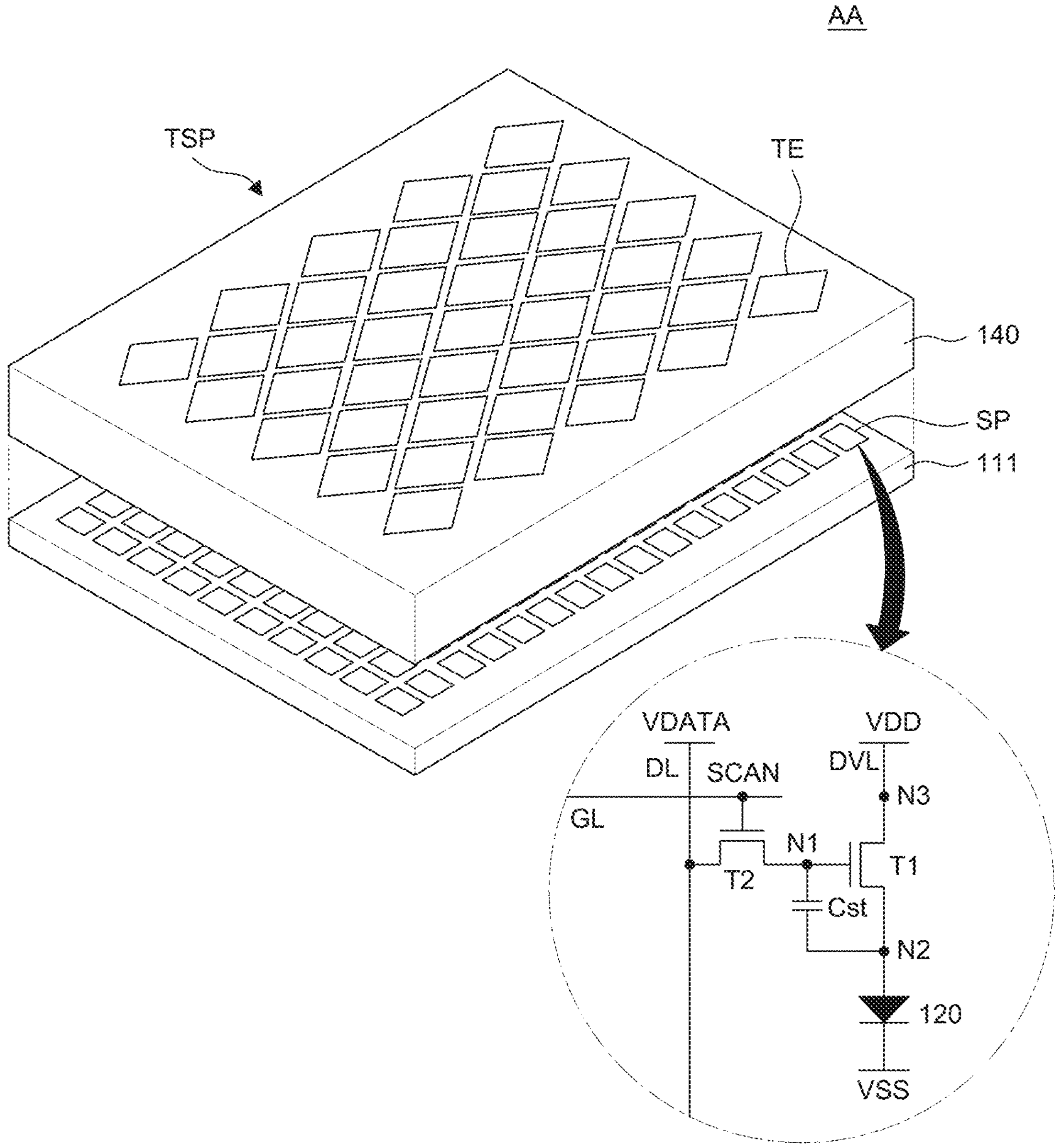
FIG. 3 is a perspective view illustrating a structure in which a touch panel is embedded in a display panel according to an exemplary embodiment of the present disclosure.

FIG. 3 is a perspective view illustrating a structure in which a touch panel is embedded in a display panel according to an exemplary embodiment of the present disclosure.

Referring to FIG. 3, for example, in the active area AA of the display panel, a plurality of sub pixels SP can be disposed above the substrate 111.

Each sub pixel SP can include a light emitting diode 120, a first transistor T1 for driving the light emitting diode 120, a second transistor 12 for transmitting a data voltage VDATA to a first node N1 of the first transistor T1, and a storage capacitor Cst for maintaining a constant voltage for one frame.

For example, the first transistor T1 can include a first node N1 to which the data voltage VDATA is applied, a second node N2 which is electrically connected to the light emitting diode 120, and a third node N3 to which a driving voltage VDD is applied from a driving voltage line DVL. The first node N1 is a gate node, the second node N2 is a source node or a drain node, and the third node N3 can be a drain node or a source node. The first transistor T1 can be referred to as a driving transistor which drives the light emitting diode 120.

The light emitting diode 120 can include a first electrode (for example, an anode), an emission layer, and a second electrode (for example, a cathode). The first electrode is electrically connected to the second node N2 of the first transistor T1 and the second electrode can be applied with a base voltage VSS.

The emission layer in the light emitting diode 120 can be a light emitting layer including an organic material or an inorganic material.

For example, the second transistor 12 is controlled to be turned on or off by a scan signal SCAN applied through the gate line GL and can be electrically connected between the first node N1 of the first transistor T1 and the data line DL. Further, the second transistor T2 can be referred to as a switching transistor.

For example, when the second transistor T2 is turned on by the scan signal SCAN, the second transistor 12 can transmit the data voltage VDATA supplied from the data line DL to the first node N1 of the first transistor T1.

The storage capacitor Cst can be electrically connected between the first node N1 and the second node N2 of the first transistor T1.

As illustrated in FIG. 3, each sub pixel SP can have a 2T1C structure including two transistors T1 and 12 and one capacitor Cst and in some cases, can further include one or more transistors or further include one or more capacitors.

The storage capacitor Cst is not a parasitic capacitor (Cgs: capacitance between gate and source, or Cgd: capacitance between gate and drain) which is an internal capacitor present between the first node N1 and the second node N2 of the first transistor T1, but can be an external capacitor which is intentionally designed at the outside of the first transistor T1.

The first transistor T1 and the second transistor T2 can be configured by an n-type transistor or a p-type transistor. As described above, in the display panel, circuit elements such as a light emitting diode 120, two or more transistors T1 and T2, and one or more capacitors Cst are disposed. The circuit element (specifically, the light emitting diode 120) is vulnerable to external moisture or oxygen so that the encapsulation unit 140 for suppressing the external moisture or oxygen from permeating the circuit element can be disposed on the display panel.

The encapsulation unit 140 can be formed by one layer, or also formed by a plurality of layers.

In the meantime, in the display device according to the exemplary embodiment of the present disclosure, the touch panel TSP can be disposed above the encapsulation unit 140.

In the display device according to the exemplary embodiment of the present disclosure, a touch sensor structure, such as a plurality of touch electrodes TE which forms a touch panel TSP, can be disposed above the encapsulation unit 140.

During the touch sensing, a touch driving signal or a touch sensing signal can be applied to the touch electrode TE. Accordingly, during the touch sensing, a potential difference is formed between the touch electrode TE and the cathode which are disposed with the encapsulation unit 140 therebetween so that unnecessary parasitic capacitance can be formed. At this time, the parasitic capacitance can degrade a touch sensitivity. Therefore, in order to lower the parasitic capacitance, a distance between the touch electrode TE and the cathode can be designed to be larger than a predetermined value (for example, 1 μm) in consideration of a display panel thickness, a display panel manufacturing process, and a display performance. To this end, for example, the thickness of the encapsulation unit 140 can be designed to be at least 1 μm or larger.

In the meantime, the display device according to the exemplary embodiment of the present disclosure can sense the touch based on capacitance formed in the touch electrode TE.

The display device according to the exemplary embodiments of the present disclosure employs a capacitance based touch sensing manner so that the touch can also be sensed by a mutual-capacitance based touch sensing manner or a self-capacitance based touch sensing manner.

For example, according to the mutual-capacitance based touch sensing manner, a plurality of touch electrodes TE can be classified into a driving touch electrode (a transmission touch electrode) to which a touch driving signal is applied and a sensing touch electrode (a reception touch electrode) which detects a touch sensing signal and forms a capacitance with the driving touch electrode.

In the case of the mutual-capacitance based touch sensing manner, the touch sensing circuit can sense the presence of the touch and/or the touch coordinate based on the change in capacitance between the driving touch electrode and the sensing touch electrode (mutual-capacitance) depending on the presence of a pointer such as a finger or a touch pen.

According to the self-capacitance based touch sensing manner, each touch electrode TE can serve as both a driving touch electrode and a sensing touch electrode. For example, the touch sensing circuit applies a touch driving signal to one or more touch electrodes TE and detects a touch sensing signal by means of the touch electrode TE applied with the touch driving signal. The touch sensing circuit TSC identifies the change in capacitance between a pointer such as a finger or a touch pen and the touch electrode TE based on the detected touch sensing signal to sense the presence of touch and/or the touch coordinate. In the self-capacitance based touch sensing manner, the driving touch electrode and the sensing touch electrode are not distinguished.

As described above, the display device according to the exemplary embodiment of the present disclosure can also sense the touch by the mutual-capacitance based touch sensing manner or the self-capacitance based touch sensing manner. However, in the following description, for the convenience of description, it will be described that the display device performs mutual-capacitance based touch sensing and includes a touch sensor structure therefor, as an example.

Hereinafter, a configuration of a sub pixel will be described in detail with reference to the drawings.

Figure 4:
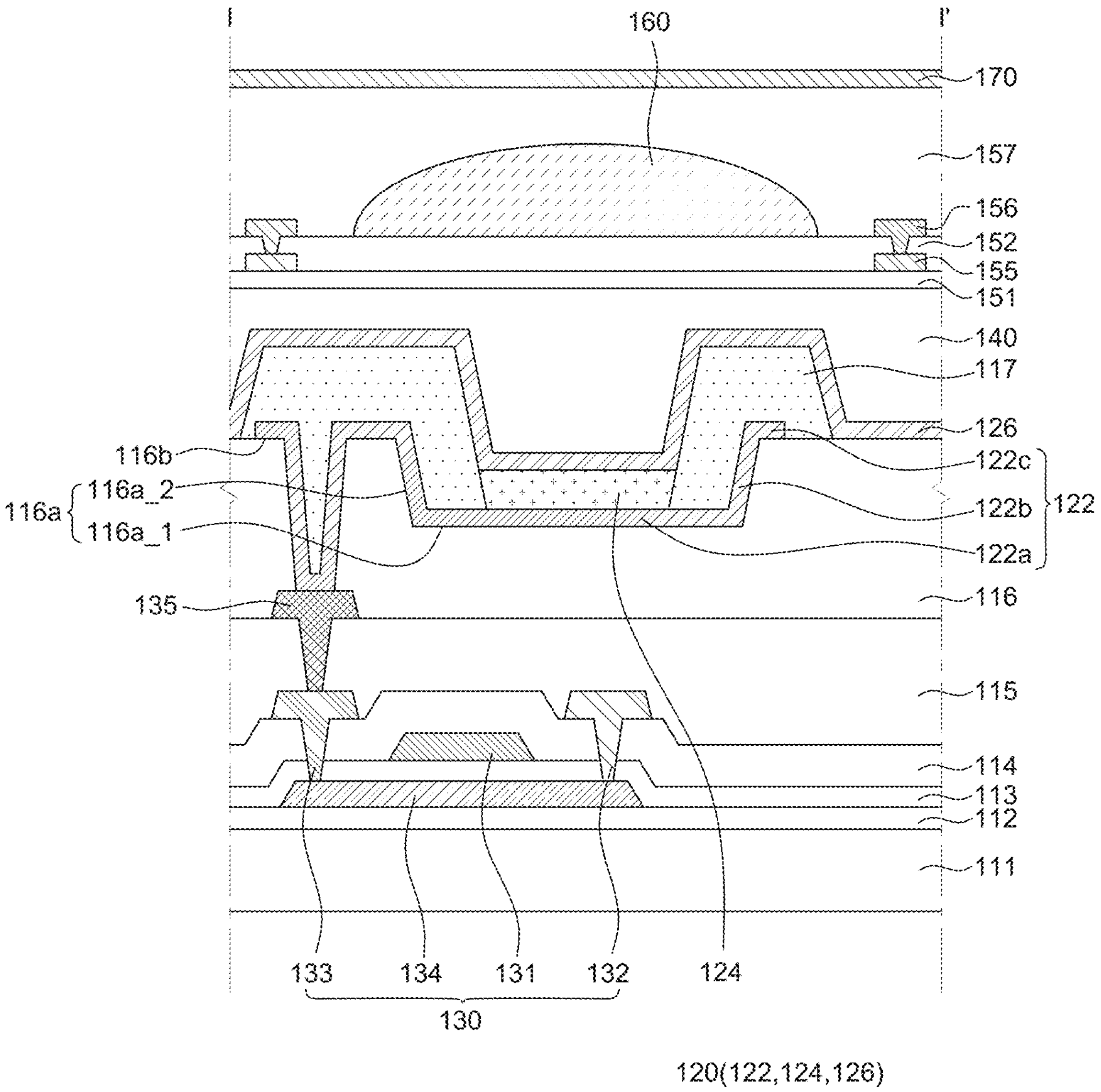
FIG. 4 is a cross-sectional view taken along line I-I' of FIG. 2.

FIG. 4 is a cross-sectional view taken along line I-I' of FIG. 2.

For example, FIG. 4 illustrates a part of a cross-sectional structure of one sub pixel of a display panel according to an exemplary embodiment of the present disclosure.

Referring to FIG. 4, a buffer layer 112, such as a multi-buffer layer or a lower buffer layer, can be disposed above the substrate 111.

Recently, the flexible substrate 111 can use a ductile material having a flexible characteristic such as plastic.

The substrate 111 can be a film type including one of a group consisting of a polyester-based polymer, a silicon-based polymer, an acrylic polymer, a polyolefin-based polymer, and a copolymer thereof.

The substrate 111 can include a first substrate, a second substrate, and an insulating film. The insulating film can be disposed between the first substrate and the second substrate. As described above, the substrate 111 is configured by the first substrate, the second substrate, and the insulating film, to suppress the moisture permeation. For example, the first substrate and the second substrate can be polyimide (PI) substrates.

For example, the multi-buffer layer can delay the spreading of the moisture or oxygen permeating the substrate 111 and can be formed by alternately laminating silicon nitride (SiNx) and silicon oxide (SiOx) at least one time.

The lower buffer layer can serve a function of protecting the semiconductor layer 134 and blocking various types of defects entering from the substrate 111. For example, the lower buffer layer can be formed by amorphous silicon, silicon nitride (SiNx), or silicon oxide (SiOx).

The switching thin film transistor (T2 in the pixel driving circuit of FIG. 3) and the driving thin film transistor 130 (T1 in the pixel driving circuit of FIG. 3) can be disposed above the buffer laver 112.

Specifically, the semiconductor layer 134 can be disposed in the active area above the substrate 111.

For example, the semiconductor layer 134 can be formed of a polycrystalline semiconductor and include a channel region, a source region, and a drain region. However, it is not limited thereto and the semiconductor layer 134 can also be configured by amorphous silicon or oxide semiconductor.

The polycrystalline semiconductor has a higher mobility than the amorphous semiconductor and the oxide semiconductor so that the power consumption is low and the reliability is excellent.

The gate insulating film 113 can be disposed on the semiconductor layer 134. The gate insulating film 113 can be configured by a single layer of silicon nitride (SiNx) or silicon oxide (SiOx) or a multilayer thereof.

A gate line is disposed on the gate insulating film 113 in a first direction and a gate electrode 131 which is connected to the gate line or formed in an island shape can be disposed.

The gate electrode 131 can be disposed on the gate insulating film 113 so as to overlap the semiconductor layer 134.

For example, the gate electrode 131 and the gate line can be configured by a single layer or multiple layers of copper (Cu), aluminum (Al), molybdenum (Mo), chrome (Cr), gold (Au), titanium (Ti), nickel (Ni), and neodymium (Nd) which are conductive metals or an alloy thereof, but is not limited thereto.

An interlayer insulating film 114 can be disposed on the gate electrode 131 so as to cover the gate electrode 131. For example, the interlayer insulating film 114 can be configured by a single layer of silicon nitride (SiNx) or silicon oxide (SiOx) or a multilayer thereof.

At this time, a partial area of the interlayer insulating film 114 and the gate insulating film 113 is selectively removed to form a contact hole which exposes both ends of the semiconductor layer 134.

The data line can be disposed on the interlayer insulating film 114 in a direction intersecting the gate line.

Further, a source electrode 132 and a drain electrode 133 which are connected to both ends of the semiconductor layer 134 can be disposed on the interlayer insulating film 114.

A protective film can be disposed on the data line and the source electrode 132 and the drain electrode 133. The protective film can be omitted as needed. The protective film can be formed as a single layer of silicon nitride (SiNx) or silicon oxide (SiOx) or a multilayer thereof.

A first planarization layer 115 can be disposed on the protective film.

The first planarization layer 115 can be configured with one or more materials of acrylic resin, epoxy resin, phenolic resin, polyamides resin, polyimides resin, unsaturated polyesters resin, polyphenylene resin, benzocyclobutene, and polyphenylene sulfides resin, but is not limited thereto.

The first planarization layer 115 can also be referred to as an overcoat layer, but is not limited thereto.

The connection electrode 135 can be disposed on the first planarization layer 115 to electrically connect the driving thin film transistor 130 and the light emitting diode 120. Further, in FIG. 4, various metal layers which serve as electric wires/electrodes, such as a data line or a signal line, can be disposed on the first planarization layer 115.

The connection electrode 135 can be configured with a material, such as copper (Cu), aluminum (Al), molybdenum (Mo), chrome (Cr), gold (Au), titanium (Ti), nickel (Ni), and neodymium (Nd), or an alloy thereof.

Further, a second planarization layer 116 can be disposed on the first planarization layer 115 and the connection electrode 135.

The second planarization layer 115 can be configured with one or more materials of acrylic resin, epoxy resin, phenolic resin, polyamides resin, polyimides resin, unsaturated polyesters resin, polyphenylene resin, benzocyclobutene, and polyphenylene sulfides resin, but is not limited thereto.

The second planarization layer 116 can also be referred to as an overcoat layer, but is not limited thereto. The second planarization layer 116 can include at least one concave portion 116*a* in one sub pixel.

Further, the second planarization layer 116 can include a peripheral portion 116*b* which encloses the concave portion 116*a* and is located in the vicinity of the concave portion 116*a*.

For example, the concave portion 116*a* can be configured by a flat portion 116*a*_1 and an inclined portion 116*a*_2 which extends from and encloses the flat portion 116*a*_1.

A surface of the flat portion 116*a*_1 of the concave portion 116*a* can be substantially parallel to a surface of the substrate 111. The inclined portion 116*a*_2 encloses the flat portion 116*a*_1 and the surface thereof can have a predetermined angle with respect to the surface of the substrate 111.

Accordingly, the surface of the inclined portion 116$a$_2 may not be parallel to the surface of the substrate 111.

The second planarization layer 116 can have a contact hole which is spaced apart from the concave portion 116$a$ to expose the connection electrode 135.

The light emitting diode 120 which is electrically connected to the connection electrode 135 through the contact hole can be disposed above the second planarization layer 116.

At this time, for example, the light emitting diode 120 can include an anode 122 connected to the drain electrode 133 of the driving thin film transistor 130, at least one emission stack 124 disposed on the anode 122, and a cathode 126 disposed on the emission stack 124. The emission stack 124 can be referred to as a light emitting unit, but is not limited by the term.

Further, for example, the anode 122 can include a first area 122$a$ whose surface is substantially parallel to a surface of the substrate 111 and a second area 112$b$ which extends from the first area 122$a$ so that a surface of the second area 112$b$ has a predetermined angle with respect to the substrate 111.

Accordingly, the surface of the second area 122$b$ may not be parallel to the surface of the substrate 111.

Further, for example, the anode 122 can include a third area 122$c$ which extends from the second area 122$b$ so that a surface of the third area 112$c$ is substantially parallel to a surface of the substrate 111. The third area 122$c$ can be an area overlapping a peripheral portion 116$b$ of the second planarization layer 116.

As described above, in at least one sub pixel, the second planarization layer 116 can include at least one contact hole which is spaced apart from the concave portion 116$a$ and the thin film transistor 130 and the anode 122 of the light emitting diode 120 can be electrically connected through the contact hole.

The anode 122 can be electrically connected to the source electrode 132 or the drain electrode 133 of the driving thin film transistor 130.

A bank 117 can be disposed above the second planarization layer 116 and a part of the anode 122.

For example, the bank 117 can include a first part and a second part. The first part is disposed on the anode 122 in an area corresponding to a part of the concave portion 116$a$ provided in the second planarization layer 116 and the second part is disposed above the anode 122 and the second planarization layer 116 in an area corresponding to the peripheral portion 116$b$ of the second planarization layer 116.

For example, the bank 117 can be disposed so as to expose a part of a top surface of the anode 122 in an area overlapping the concave portion 116$a$. For example, at least one sub pixel can have an area in which the anode 122 does not overlap the bank 117.

For example, the bank 117 can be configured with an organic material, such as photo acryl, or a translucent material, but is not limited thereto and also can be configured with an opaque material to suppress the optical interference between sub pixels.

The emission stack 124 of the light emitting diode 120 including at least one emission layer can be disposed on the anode 122 which does not overlap the bank 117.

The emission stack 124 can include a hole injection layer, a hole transport layer, an emission layer, an electron transport layer, and an electron injection layer. In a tandem structure in which a plurality of emission layers is overlaid, a charge generation layer can be further disposed between the emission layers. The emission layer can emit different color light in every sub pixel. For example, a red emission layer, a green emission layer, and a blue emission layer can be separately disposed in every sub pixel. However, a common emission layer is formed in every sub pixel to emit white light regardless of the color and a color filter which distinguishes the color can also be separately provided. The emission layer can be individually disposed, but the hole injection layer, the electron injection layer, the hole transport layer, or the electron transport layer is provided as a common layer to be disposed in each sub pixel in the same way.

The emission stack 124 can also be configured by laminating the hole transport layer, the emission layer, and the electron transport layer in this order or a reverse order, on the anode 122. In addition, the emission stack 124 can also include first and second emission stacks which are opposite to each other with the charge generating layer therebetween.

Some organic layers of the emission stack 124 can be formed by a deposition or coating method having straightness. For example, the organic layer can be formed by physical vapor deposition (PVD), such as an evaporation process. In this case, a thickness of the organic layer in an area having a predetermined angle with respect to a horizontal plane can be smaller than a thickness in an area parallel to the horizontal plane. For example, a thickness of the organic layer disposed in an area corresponding to the inclined portion 116$a$2 of the concave portion 116$a$ can be smaller than a thickness of the organic layer disposed on the top surface of the anode 122 exposed by the bank 117. Further, for example, the thickness of the organic layer disposed in an area corresponding to the inclined portion 116$a$_2 of the concave portion 116$a$ can be smaller than a thickness of the organic layer disposed on the peripheral portion 116$b$.

Therefore, when the light emitting diode 120 having different thickness of the organic layer in different areas is driven, in an area in which the thickness of the organic layer is relatively thin, for example, in an area corresponding to the inclined portion 116$a$2 of the concave portion 116$a$, a highest current density is applied, if the second area of the anode disposed in the area corresponding to the inclined portion 116$a$_2 is not covered by the bank. Further, in an area corresponding to the inclined portion 116$a$_2 of the concave portion 116$a$, a strong electric field can be applied. Accordingly, an emission characteristic of the light emitting diode in the area corresponding to the inclined portion 116$a$_2 of the concave portion 116$a$ and an emission characteristic of the light emitting diode 120 in the area corresponding to the flat portion 116$a$_1 of the concave portion 116$a$ can be different. By doing this, the light emitting unit can be deteriorated. However, a thickness condition of the organic layer according to the present disclosure is not limited thereto and the thickness of the organic layer can have a corresponding thickness in every position.

In the exemplary embodiment of the present disclosure, the bank 117 is disposed so as to cover the inclined portion 116$a$2 of the concave portion 116$a$. By doing this, the deterioration of the light emitting unit in the area corresponding to the inclined portion 116$a$_2 of the concave portion 116$a$ and a phenomenon that the emission characteristics vary in every area can be suppressed.

In the meantime, the anode 122 can include a reflective metal.

Even though in FIG. 4, for the convenience of description, an example that the anode 122 is configured as a single layer is illustrated, the present disclosure is not limited thereto and the anode can be configured with a multi-layered structure.

When the anode 122 is configured with the multi-layered structure, at least one layer can include a reflective metal.

For example, the anode 122 can be configured with a multi-layered structure including a transparent layer configured by a transparent conductive film and a reflective layer configured by an opaque conductive film having a good reflection efficiency. For example, the transparent conductive film is configured with a material having a relatively high work function, such as indium-tin-oxide (ITO) or indium-zinc-oxide (IZO) and the opaque conductive film can be configured as a single or multilayered structure including aluminum (Al), silver (Ag), copper (Cu), lead (Pb), molybdenum (Mo), titanium (Ti), or an alloy thereof. For example, the anode 122 is configured by a structure in which a transparent conductive film, an opaque conductive film, and a transparent conductive film are sequentially laminated or can also be configured by a structure in which a transparent conductive film and an opaque conductive film are sequentially laminated.

In the meantime, the second area 122*b* and the third area 122*c* of the anode 122 can be disposed on a side surface of the inclined portion 116*a*2 and a top surface of the peripheral portion 116*b* of the second planarization layer 116, respectively, along shapes of the inclined portion 116*a*_2 and the peripheral portion 116*b*. The second area 122*b* of the anode 122 disposed on the side surface of the inclined portion 116*a*_2 of the second planarization layer 116 can be tapered with an angle of approximately 30° to 60°, but it is not limited thereto. The second area 122*b* of the anode 122 including the reflective layer can serve as a side-surface mirror.

When the display device according to the exemplary embodiment of the present disclosure is a top emission type light emitting display device, the reflective layer of the anode 122 can upwardly reflect the light emitted from the light emitting diode 120. The light generated in the emission stack 124 of the light emitting diode 120 can be emitted not only upwardly, but also laterally. The laterally emitted light is directed into the display device, or can be trapped in the display device by the total reflection, or can travel into the display device and then dissipate. Therefore, according to the present disclosure, the second area 122*b* of the anode 122 including the reflective layer is disposed so as to cover the side surface of the inclined portion 116*a*_2 of the second planarization layer 116 to change a traveling direction of light which laterally travels to an upward direction. Therefore, the light extraction efficiency of the display device can be improved.

The cathode 126 can be disposed on the emission stack 124 so as to be opposite to the anode 122 with the emission stack 124 therebetween. When the cathode 126 is applied to a top emission type light emitting display panel, the cathode can be configured by a transparent conductive film obtained by forming indium tin oxide (ITO), indium zinc oxide (IZO), or magnesium-silver (Mg—Ag) to be thin.

An encapsulation unit 140 can be disposed above the cathode 126 to protect the light emitting diode 120. The light emitting diode 120 can react to external moisture and oxygen due to a characteristic of the organic material of the emission stack 124 to cause dark-spot or pixel shrinkage phenomenon. In order to suppress this problem, the encapsulation unit 140 can be disposed above the cathode 126. The encapsulation unit 140 can be configured by a first inorganic insulating film, a foreign material compensation layer, and a second inorganic insulating film.

The first inorganic insulating film can be disposed above the substrate 111 in which the cathode 126 is disposed to be the most adjacent to the light emitting diode 120. The first inorganic encapsulation film can be formed of an inorganic insulating material on which low-temperature deposition is allowed, such as silicon nitride (SiNx), silicon oxide (SiOx), silicon oxynitride (SiON), or aluminum oxide ($Al_2O_3$). The first inorganic insulating film is deposited under a low temperature environment so that the damage of the emission stack 124 including an organic material vulnerable to the high temperature atmosphere during the deposition can be suppressed.

The foreign material compensation layer can be disposed to have a smaller area than the first inorganic insulating film and be configured to expose both ends of the first inorganic insulating film. The foreign material compensation layer 144 can be formed of an organic insulating material, such as acrylic resin, epoxy resin, polyimide, polyethylene, or silicon oxy carbon (SiOC).

In the meantime, when the foreign material compensation layer is formed by an inkjet method, one or more dams can be disposed in a boundary area of the non-active area and the active area or a dam area corresponding to a partial area in the non-active area can be disposed. In such a dam area, a primary dam adjacent to the active area and a secondary dam adjacent to the pad unit can be disposed.

When a liquid type of foreign material compensation layer is dropped in the active area, one or more dams disposed in the dam area suppress the liquid type of foreign material compensation layer from collapsing in the direction of the non-active area to invade the pad unit.

The primary dam and/or secondary dam can be configured as a single layer or a multiple layered structure. For example, the primary dam and/or secondary dam can be simultaneously configured with the same material as at least one of the bank 117 and the spacer. In this case, the dam structure can be configured without having the mask adding process and increasing the cost.

Further, the foreign material compensation layer including an organic material can be located only on an inner surface of the primary dam.

Further, the second inorganic insulating film can be disposed so as to cover an upper surface and a side surface of each of the first inorganic insulating film and the foreign material compensation layer. The second inorganic insulating film can serve to minimize or block the permeation of the external moisture or oxygen into the first inorganic insulating film and the foreign material compensation layer. The second inorganic encapsulation layer can be formed of an inorganic insulating material, such as silicon nitride (SiNx), silicon oxide (SiOx), silicon oxynitride (SiON), or aluminum oxide ($Al_2O_3$).

A touch buffer film 151 can be disposed on the encapsulation unit 140.

A bridge pattern 155 can be disposed on the touch buffer film 151. However, it is not limited thereto and a touch electrode (or a touch line) can also be disposed on the touch buffer film 151.

The touch buffer film 151 can be located between the bridge pattern 155 and the encapsulation unit 140.

For example, the touch buffer film 151 can be designed to maintain a predetermined minimum interval between the bridge pattern 155 and the cathode 126. By doing this, a parasitic capacitance which can be formed between the bridge pattern 155 and the cathode 126 can be reduced or suppressed so that a touch sensitivity degradation due to the parasitic capacitance can also be suppressed.

The bridge pattern 155 can be disposed above the encapsulation unit 140 without having the touch buffer film 151.

The bridge pattern 155 can have a single-layer or multi-layered structure formed of a metal having strong corrosion resistance and acid resistance, such as aluminum (Al), titanium (Ti), copper (Cu), or molybdenum (Mo).

The touch insulting film 152 can be disposed on the bridge pattern 155.

For example, the touch insulating film 152 can use an organic film or an inorganic film which can be formed by a low temperature process. When the organic film is used for the touch insulating film 152, after coating the organic film above the substrate 111, the organic film is cured at a temperature of 100° C. or lower to form the touch insulating film 152 to suppress the damage of the emission stack 124 vulnerable to the high temperature. When the inorganic film is used for the touch insulating film 152, in order to suppress the damage of the emission stack 124 vulnerable to the high temperature, a low temperature CVD deposition process and a washing process are repeated at least two times to form the touch insulating film 152 with a multilayered structure.

A partial area of the touch insulating film 152 is selectively removed to form a touch contact hole to expose a part of the bridge pattern 155.

A touch electrode (or a touch line) 156 can be disposed on the touch insulating film 152. However, it is not limited thereto and the bridge pattern can also be disposed on the touch insulating film 152.

The touch electrode 156 can be electrically connected to the bridge pattern 155 through the touch contact hole.

The planarization layer can be disposed on the touch electrode 156, but is not limited thereto and the planarization layer can also be omitted.

In the meantime, in the exemplary embodiment of the present disclosure, a lens 160 can be disposed above the encapsulation unit 140.

The lens 160 can be disposed above the touch insulating film 152. The lens 160 can be located on a path of light emitted from the light emitting diode 120.

For example, a lower surface of the lens 160 which faces the light emitting diode 120 can be a flat plane. For example, a surface of the lens 160 facing the UV shielding layer 170 of the present disclosure can have a convex spherical surface, for example, a semicircular shape.

For example, each sub pixel can overlap one lens 160. Accordingly, in the display device according to the exemplary embodiment of the present disclosure, light emitted from each sub pixel passes through the lens 160 to be provided to a user. Accordingly, in the display device according to the exemplary embodiment of the present disclosure, a luminance viewing angle can be improved.

For example, the lens 160 of the exemplary embodiment of the present disclosure includes the light emitting diode 120 above the touch insulating film 152 to cover (block) the first area 122*a* and second area 122*b* of the anode 122, but is not limited thereto. For example, the lens 160 of the exemplary embodiment of the present disclosure can extend to the third area 122*c* of the anode 122.

The planarization layer 157 can be disposed above the lens 160 so as to cover the lens 160.

The polarization film 157 can suppress the damage of the lens 160 due to the external impact. For example, the semicircular surface of each lens 160 can be fully covered by the planarization layer 157. The planarization layer 157 can remove a step by the lens 160. For example, a surface of the planarization layer 157 which is opposite to the encapsulation unit 140 can be a flat plane. The planarization layer 157 can include an insulating material. The planarization layer 157 can have a refractive index which is different from that of the lens 160. For example, the refractive index of the planarization layer 157 can be lower than a refractive index of the lens 160. Therefore, in the display device according to the exemplary embodiment of the present disclosure, light emitted from the light emitting diode 120 of each sub pixel can be effectively condensed by the lens 160 and the planarization layer 157.

The UV shielding layer 170 according to the present disclosure can be disposed on the planarization layer 157.

The UV shielding layer 170 can also be referred to as a UV absorbing layer or a light shielding layer, but is not limited by the term, and shields and/or absorbs UV rays (UV lights).

When the display device is exposed to the UV rays for a long time, pixel shrinkage phenomenon in which an emission area is contracted can be caused by outgas of the thin film transistor. The pixel shrinkage phenomenon can significantly affect in the present disclosure which improves the light extraction efficiency and the luminance viewing angle using the side-surface mirror type anode 122 and the convex spherical lens 160.

Therefore, in the exemplary embodiment of the present disclosure, the UV shielding layer 170 which can absorb the UV rays can be disposed above the encapsulation unit 140. Accordingly, the damage of the light emitting diode 120 due to the UV ray is suppressed to improve the reliability.

For example, as the UV shielding layer 170, hydrogen atoms (—H) and ketone (=O) or imine (=N) parts are close to each other to form hydrogen bonding so that a material which does not emit light, but discharges heat when the UV rays are absorbed can be used. For example, the UV shielding layer can include benzophenone derivatives, xantone derivatives, triazine derivatives, salicylate derivatives, benzotriazole derivatives, or hydroxyflavone derivatives.

According to the exemplary embodiment of the present disclosure, the UV ray absorbing material which is included in the UV shielding layer 170 can be one of the following materials of Formula 1 to Formula 7. However, the exemplary embodiments of the present disclosure are not limited thereto and can apply any material having a high absorptance in approximately 400 to 500 nm which is a UV ray absorption wavelength band.

The following Formula 1 to Formula 7 show a chemical structure of a phenol UV absorbent as an example.

[Formula 1]

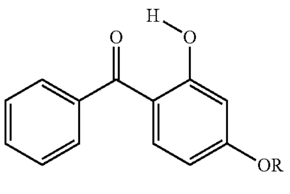

Formula 1 is 2-hydroxybenzophenones.

[Formula 2]

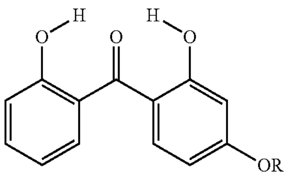

Formula 2 is 2,2'-dihydroxybenzophenones.

[Formula 3]

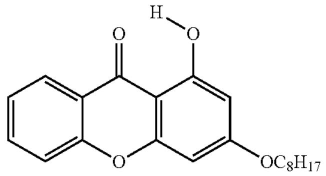

Formula 3 is xantone.

[Formula 4]

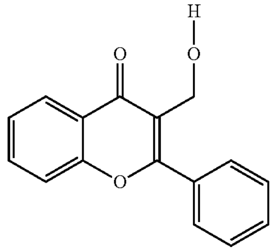

Formula 4 is 3-hydroxyflavone.

[Formula 5]

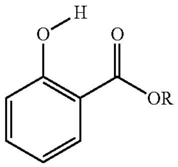

Formula 5 is salicylate.

[Formula 6]

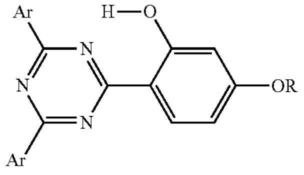

Formula 6 is 2-2(-hydroxyphenyl)-1,3,5-trazines.

[Formula 6]

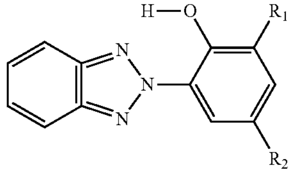

Formula 7 is 2-(2-hydroxyphenyl) benzotriazole.

In the meantime, according to the present disclosure, the UV shielding layer can be applied not only to an upper portion of the encapsulation unit, but also to top surfaces of the second area and the third area of the anode. In this case, the UV ray which is (reversely) reflected to the light emitting diode can be effectively blocked by the side-mirror shape anode, which will be described in more detail with reference to the drawing.

Figure 5:
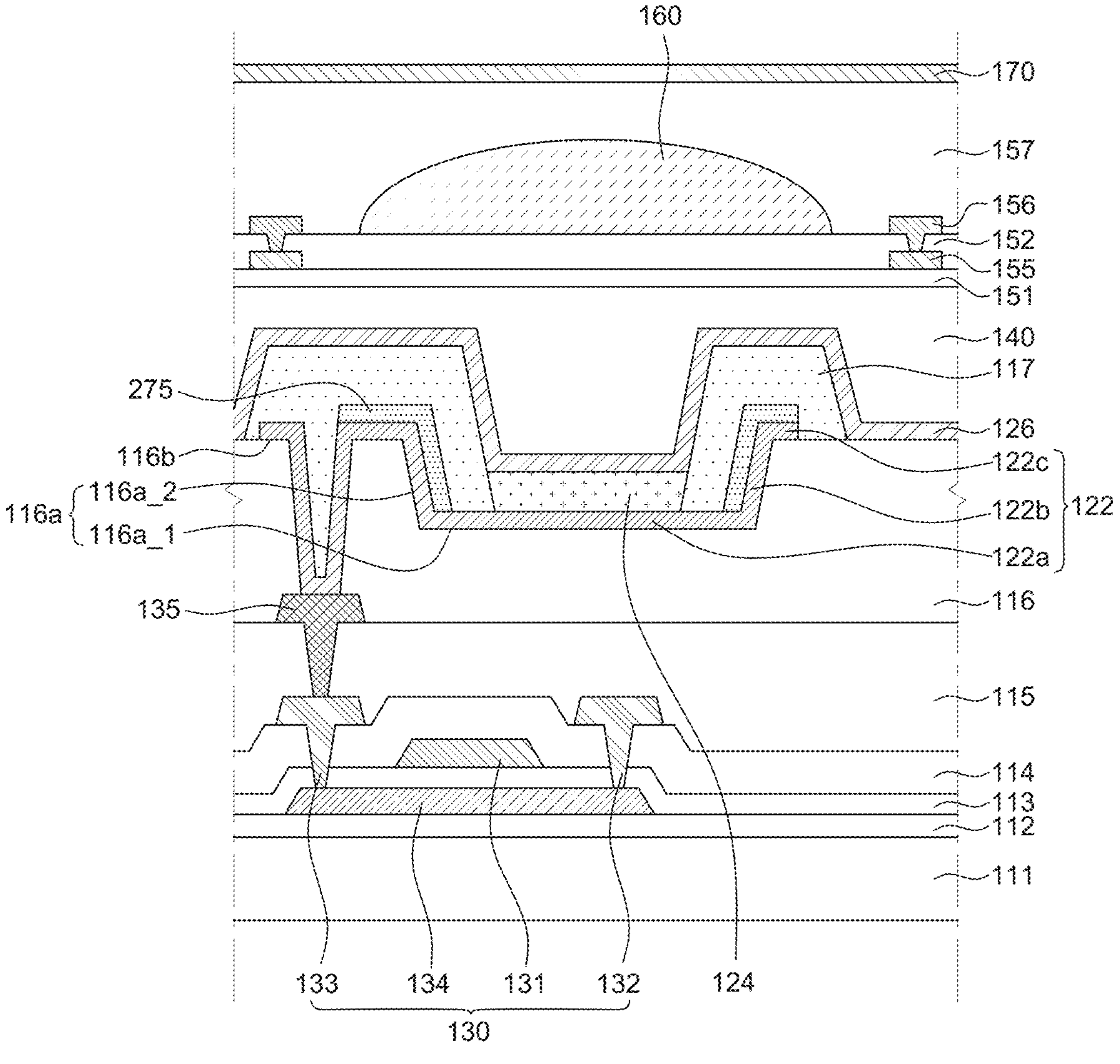
FIG. 5 is a view illustrating a part of a cross-section of a display panel according to another exemplary embodiment of the present disclosure.

FIG. 5 is a view illustrating a part of a cross-section of a display panel according to another exemplary embodiment of the present disclosure.

In the display panel according to another exemplary embodiment of the present disclosure of FIG. 5, a second UV shielding layer 275 is additionally disposed on top surfaces of the second area 122*b* and the third area 122*c* of the anode 122, as compared with the above-described display panel according to the exemplary embodiment of the present disclosure. However, the other configurations are substantially the same so that a redundant description will be omitted.

For example, FIG. 5 illustrates a part of a cross-sectional structure of one sub pixel of a display panel according to another exemplary embodiment of the present disclosure.

Referring to FIG. 5, in the same way as the above-described exemplary embodiment, a driving circuit including a light emitting diode 120 and a driving thin film transistor 130 can be disposed above the substrate 111.

As described above, for example, the second planarization layer 116 can include at least one concave portion 116*a* in one sub pixel.

Further, the second planarization layer 116 can include a peripheral portion 116*b* which encloses the concave portion 116*a* and is located in the vicinity of the concave portion 116*a*.

For example, the concave portion 116*a* can be configured by a flat portion 116*a*_1 and an inclined portion 116*a*_2 which encloses the flat portion 116*a*_1.

A surface of the flat portion 116*a*_1 of the concave portion 116*a* can be substantially parallel to a surface of the substrate 111. The inclined portion 116*a*_2 encloses the flat portion 116*a*_1 and the surface thereof can have a predetermined angle with respect to the surface of the substrate 111.

Accordingly, the surface of the inclined portion 116*a*_2 may not be parallel to the surface of the substrate 111.

The second planarization layer 116 can have a contact hole which is spaced apart from the concave portion 116*a* to expose the connection electrode 135.

The light emitting diode 120 which is electrically connected to the connection electrode 135 through a contact hole can be disposed above the second planarization layer 116.

At this time, for example, the light emitting diode 120 can include an anode 122 connected to the drain electrode 133 of the driving thin film transistor 130, at least one emission stack 124 disposed on the anode 122, and a cathode 126 disposed on the emission stack 124.

Further, for example, the anode 122 can include a first area 122*a* whose surface is substantially parallel to a surface of the substrate 111 and a second area 122*b* which extends from the first area 122*a* so that a surface of the second area 122*b* has a predetermined angle with respect to the substrate 111.

Accordingly, the surface of the second area 122*b* may not be parallel to the surface of the substrate 111.

Further, for example, the anode 122 can include a third area 122*c* which extends from the second area 122*b* so that a surface of the third area 122*c* is substantially parallel to a surface of the substrate 111. The third area 122*c* can be an area overlapping a peripheral portion 116*b* of the second planarization layer 116.

As described above, in at least one sub pixel, the second planarization layer 116 can include at least one contact hole which is spaced apart from the concave portion 116*a* and the driving thin film transistor 130 and the anode 122 of the light emitting diode 120 can be electrically connected through the contact hole.

In the meantime, according to another exemplary embodiment of the present disclosure, the second UV shielding layer 275 can be disposed on top surfaces of the second area 122*b* and the third area 122*c* of the anode 122.

In FIG. 5, an example that the second UV shielding layer 275 can be disposed on the entire top surface of the second area 122*b* and a part of the top surface of the third area 122*c* of the anode 122 is illustrated, but the present disclosure is not limited thereto. The second UV shielding layer 275 can also be disposed on the entire top surface of the third area 122*c* of the anode 122 or disposed to cover the third area 122*c* of the anode 122. For example, the second UV shielding layer 275 can be in contact with the top surfaces of the second area 122*b* and the third area 122*c* of the anode 122, but the present disclosure is not limited thereto and another layer can be interposed therebetween.

As described above, for example, as the second UV shielding layer 275, hydrogen atoms (—H) and ketone (═O) or imine (═N) parts are close to each other to form hydrogen bonding so that a material which does not emit light, but discharges heat when the UV ray is absorbed can be used. For example, the second UV shielding layer can include triazine derivatives, salicylate derivatives, benzotriazole derivatives, benzophenone derivatives, xantone derivatives, or hydroxyflavone derivatives.

For example, the UV ray absorbing material included in the second UV shielding layer 275 can be one of materials of Formulae 1 to 7.

According to another exemplary embodiment of the present disclosure, the second UV shielding layer 275 is applied to the top surfaces of the second area 122*b* and the third area 122*c* of the anode 122 to effectively block the UV ray which is (reversibly) reflected to the light emitting diode 120 by the side-mirror shaped anode 122.

The bank 117 can be disposed above the second planarization layer 116 and a part of the anode 122. Further, the bank 117 according to another exemplary embodiment of the present disclosure can be disposed so as to cover the second UV shielding layer 275.

For example, the bank 117 can include a first part and a second part. The first part is disposed on the anode 122 and the second UV shielding layer 275 in an area corresponding to a part of the concave portion 116*a* provided in the second planarization layer 116. The second part is disposed above the anode 122, the second UV shielding layer 275, and the second planarization layer 116 in an area corresponding to the peripheral portion 116*b* of the second planarization layer 116.

For example, the bank 117 can be disposed so as to expose a part of a top surface of the anode 122 in an area overlapping the concave portion 116*a*. For example, at least one sub pixel can have an area in which the anode 122 does not overlap the bank 117.

For example, the bank 117 can be configured with an organic material, such as photo acryl, or a translucent material, but is not limited thereto and also can be configured with an opaque material.

In the meantime, the encapsulating unit 140 can be disposed above the light emitting diode 120.

Further, the lens 160 can be disposed above the encapsulation unit 140.

The lens 160 can be located on a path of light emitted from the light emitting diode 120.

For example, a lower surface of the lens 160 which is directed to the light emitting diode 120 can be a flat plane. For example, a surface of the lens 160 facing the UV shielding layer 170 of the present disclosure can have a convex spherical surface, for example, a semicircular shape.

For example, each sub pixel can overlap one lens 160.

The planarization laver 157 can be disposed above the lens 160 so as to cover the lens 160.

For example, the convex-spherical surface of lens 160 can be fully covered by the planarization layer 157. The planarization layer 157 can remove a step by the lens 160. For example, a surface of the planarization layer 157 which is opposite to the encapsulation unit 140 can be a flat plane. The planarization layer 157 can include an insulating material.

The planarization layer 157 can have a refractive index which is different from that of the lens 160. For example, the refractive index of the planarization layer 157 can be lower than a refractive index of the lens 160.

The first UV shielding layer 170 can be disposed on the planarization layer 157.

For example, the first UV shielding layer 170 can include benzophenone derivatives, xantone derivatives, triazine derivatives, salicylate derivatives, benzotriazole derivatives, or hydroxyflavone derivatives, to be the same as the second UV shielding layer 275.

For example, the UV ray absorbing material which is included in the first UV shielding layer 170 can be one of the above-described materials of Formulae 1 to 7. However, the exemplary embodiments of the present disclosure are not limited thereto and can apply any material having a high absorptance in approximately 400 to 500 nm which is a UV ray absorption wavelength band.

Figure 6A:
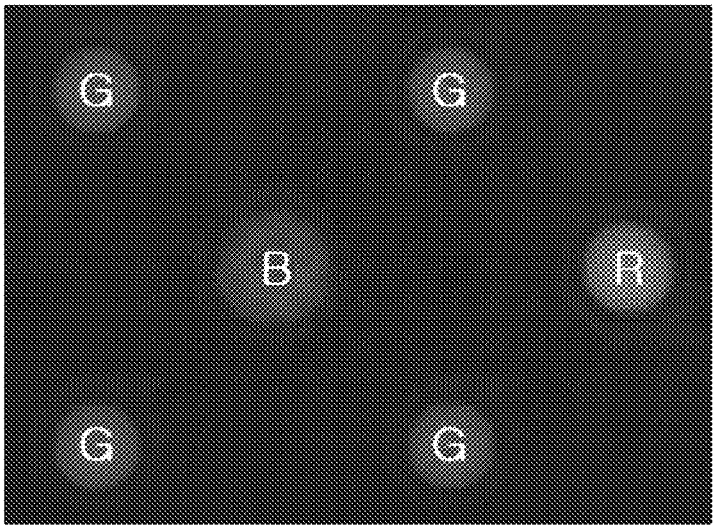
FIGS. 6A and 6B are views illustrating an example of pixel shrinkage phenomenon after irradiating UV rays.
Figure 6B:
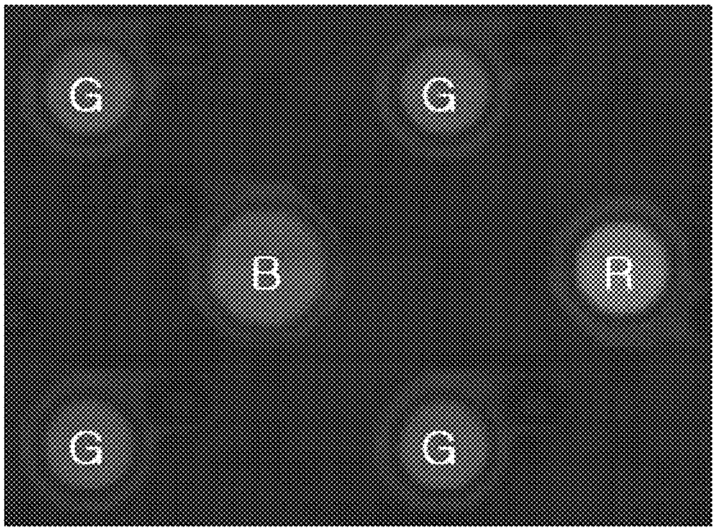

FIGS. 6A and 6B are views illustrating pixel shrinkage phenomenon phenomenon after irradiating UV rays (UV light).

FIG. 6A is an image showing the pixel shrinkage phenomenon after irradiating the UV light according to a Comparative Example in which the UV shielding layer of the present disclosure is not applied and FIG. 6B is an image showing the pixel shrinkage phenomenon after irradiating the UV ray according to an example in which the UV shielding layer (UV ray shielding layer) of the present disclosure is applied.

For example, FIGS. 6A and 6B illustrate pixel shrinkage phenomenon in a blue sub pixel B.

For example, FIGS. 6A and 6B illustrate the pixel shrinkage phenomenon after irradiating UV ray of 420 nm with an energy of 2.4 $W/m^2$ in the environment of 30° and 30% for 200 hours.

Referring to FIGS. 6A and 6B, it is confirmed that as Comparative Example in which the UV shielding laver is not applied, the pixel shrinkage phenomenon is significantly alleviated in the example in which the UV shielding layer is applied.

Figure 7A:
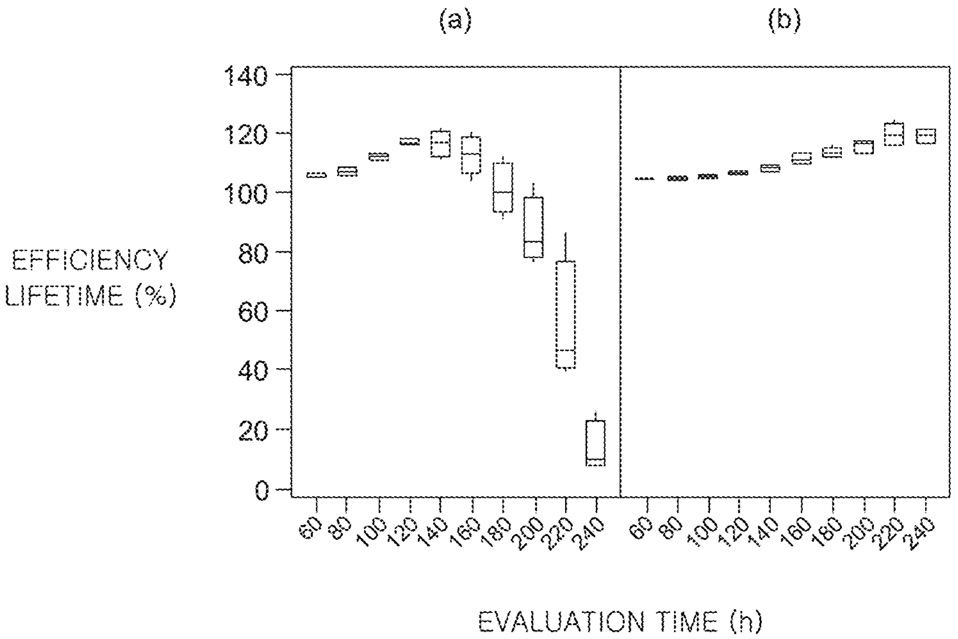
FIGS. 7A to 7C are graphs illustrating an example of a change in efficiency according to UV ray irradiation.
Figure 7B:
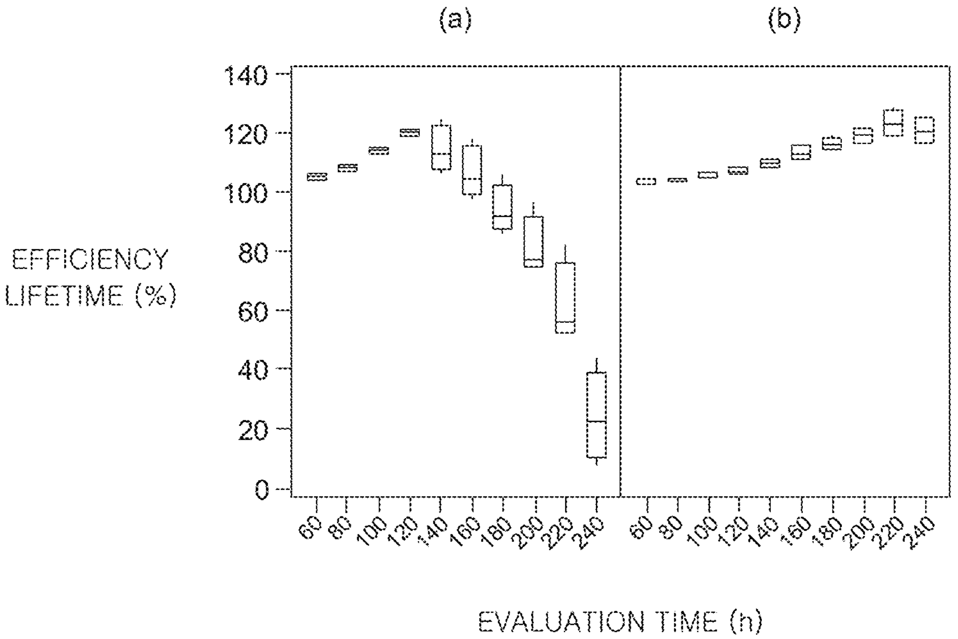
Figure 7C:
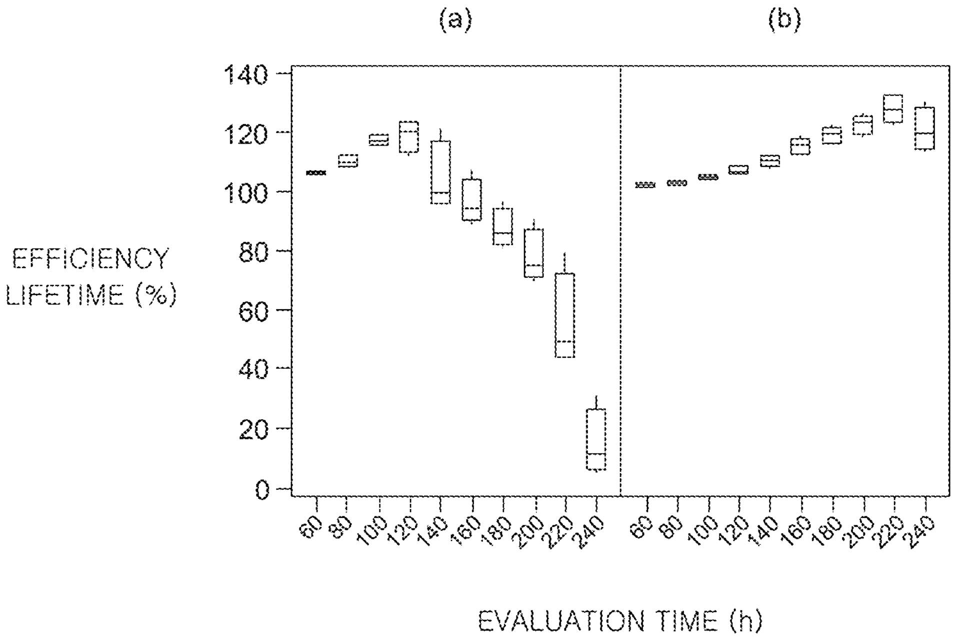

FIGS. 7A to 7C are graphs illustrating efficiency difference according to UV ray irradiation.

In each graph of FIGS. 7A to 7C, a left (a) shows the efficiency difference according to the UV ray irradiation in Comparative Example in which the UV shielding layer is not applied and a right (b) shows the efficiency difference according to the UV ray irradiation in Example in which the UV shielding layer is applied.

Each graph of FIGS. 7A to 7C shows an efficiency lifetime for the efficiency difference according to the UV ray irradiation for 240 hours.

FIGS. 7A, 7B, and 7C show efficiency lifetimes for red, green, and blue, respectively.

Referring to FIGS. 7A, 7B, and 7C, it is understood that in Comparative Example in which the UV shielding layer is not applied, the efficiency lifetime is sharply reduced over time. Specifically, it is understood that the efficiency lifetime is very sharply reduced after 140 hours.

In contrast, in Example in which the UV shielding layer is applied, the efficiency lifetime is not reduced over time, but is increased.

As described above, in Example in which the UV shielding layer is applied, the UV shielding layer absorbs and blocks the UV rays directed to the light emitting diode so that the damage of the light emitting diode can be suppressed.

In the meantime, in the top emission type light emitting display panel, a hole transporting layer P-HTL including a P-dopant can be additionally required to increase the hole transporting ability of the hole transporting layer HTL in accordance with the increase in thickness.

In this case, a concentration of the P-dopant is normally 3 to 5%. When the concentration is lower than this, the performance of the light emitting diode can be degraded and when the concentration is higher than this, leakage current can be caused. In the meantime, when the UV shielding layer of the present disclosure is applied, the P-dopant can be applied by less than 0.6%, which will be described in detail with reference to the following drawing.

Figure 8:
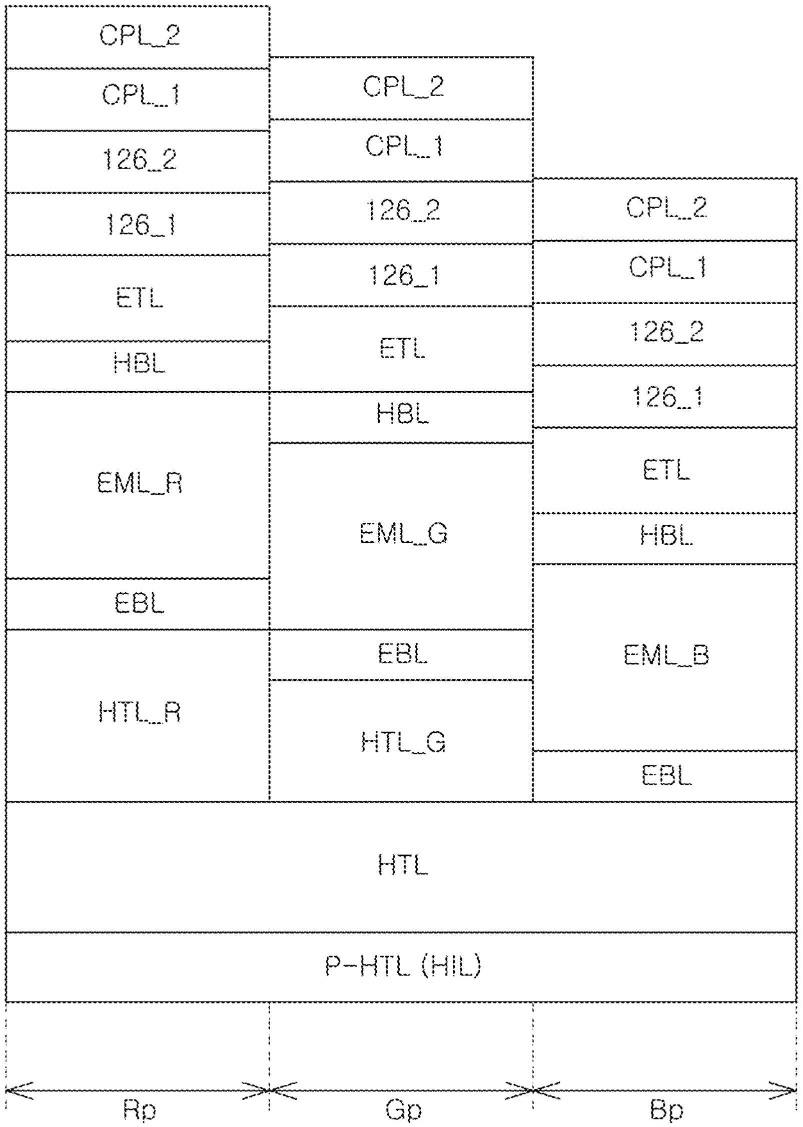
FIG. 8 is a view illustrating a lamination structure of a light emitting diode according to an example of the present disclosure.

FIG. 8 is a view illustrating a lamination structure of a light emitting diode.

FIG. 8 illustrates a lamination structure of a top emission type light emitting diode.

Referring to FIG. 8, the light emitting diode according to the exemplary embodiment of the present disclosure can include an anode, a P-doped hole transporting layer P-HTL, a hole transporting layer HTL, a red hole transporting layer HTL_R, a green hole transporting layer HTL_G, an electron blocking layer EBL, a red light emitting layer EML_R, a green light emitting layer EML_G, a blue light emitting layer EML_B, a hole blocking layer HBL, an electron transporting layer ETL, cathodes 126_1 and 126_2, and capping layers CPL_1 and CPL_2 above a substrate in which a red sub pixel region Rp, a green sub pixel region Gp, and a blue sub pixel region Bp are defined.

The light emitting diode according to the exemplary embodiment of the present disclosure can also have a double stack structure configured by a first light emitting unit including a first emission layer and a second light emitting unit including a second emission layer between the anode and the cathodes 126_1 and 126_2.

Further, a gate line and a data line which intersect each other to define each sub pixel and a power line which extends to be parallel to one of the gate line and the data line are disposed above the substrate. In each sub pixel, a switching thin film transistor which is electrically connected to the gate line and the data line and a driving thin film transistor which is connected to the switching thin film transistor can be provided. The driving thin film transistor can be connected to the anode of the light emitting diode.

For example, the anode is disposed above the substrate so as to correspond to each of the red sub pixel region Rp, the green sub pixel region Gp, and the blue sub pixel region Bp and can include a reflective layer.

The hole transporting layer HTL can be disposed above the anode so as to correspond to all the red sub pixel region Rp, the green sub pixel region Gp, and the blue sub pixel region Bp.

The red hole transporting layer HTL_R and the green hole transporting layer HTL_G can be disposed above the hole transporting layer HTL in the red sub pixel region Rp and the green sub pixel region Gp, respectively.

The electron blocking layer EBL can be disposed above the red hole transporting layer HTL_R, the green hole transporting layer HTL_G, and the hole transporting layer HTL so as to correspond to all the red sub pixel region Rp, the green sub pixel region Gp, and the blue sub pixel region Bp.

The red emission layer EML_R is disposed in the red sub pixel region Rp on the electron blocking layer EBL and the green emission layer EML_G can be disposed in the green sub pixel region Gp on the electron blocking layer EBL. The red emission layer EML_R and the green emission layer EML_G can include emission materials which emit red light and green light, respectively, and the emission material can be formed using a phosphor or a fluorescent material.

The blue emission layer EML_B can be disposed in the blue sub pixel region Bp on the electron blocking layer EBL. The blue emission layer EML_B can include an emission material which emits blue light and the emission material can be formed using a phosphor or a fluorescent material.

The hole blocking layer HBL can be disposed above the red emission layer EML_R, the green emission layer EML_G, and the blue emission layer EML_B so as to correspond to all the red sub pixel region Rp, the green sub pixel region Gp, and the blue sub pixel region Bp.

The electron transporting layer ETL can be disposed above the hole blocking layer HBL so as to correspond to all the red sub pixel region Rp, the green sub pixel region Gp, and the blue sub pixel region Bp.

The electron transporting layer ETL can serve to transport and inject the electrons and the thickness can be adjusted in consideration of the electron transporting characteristic.

Further, the electron injection layer can also be further configured above the electron transporting layer ETL.

Here, the structure is not limited according to the exemplary embodiment of the present disclosure, at least one of the hole transporting layer HTL, the electron blocking layer EBL, the hole blocking layer HBL, the electron transporting layer ETL, and the electron injection layer can also be omitted. Further, any one of the hole transporting layer HTL, the electron blocking layer EBL, the hole blocking layer HBL, the electron transporting layer ETL, and the electron injection layer can also be formed as two or more layers.

In the meantime, when a double stack structure is configured, a charge generation layer can be additionally disposed between the first light emitting unit and the second light emitting unit and a charge balance between the first light emitting unit and the second light emitting unit can be adjusted.

The charge generation layer can include a first charge generation layer and a second charge generation layer. The first charge generation layer serves as an n-type charge generation layer which helps to inject the electron into the first light emitting unit disposed therebelow and the second charge generation layer can serve as a p-type charge generation layer which helps to inject the hole into the second light emitting unit disposed thereabove.

The cathodes 126_1 and 126_2 can be disposed above the electron transporting layer ETL so as to correspond to all the red sub pixel region Rp, the green sub pixel region Gp, and the blue sub pixel region Bp. For example, the cathodes 126_1 and 126_2 are formed by an alloy (Mg:Ag) of magnesium and silver to have a transflective characteristic.

For example, even though in FIG. 8, the cathodes 126_1 and 126_2 are configured by two layers of a first cathode 126_1 and a second cathode 126_2, the present disclosure is not limited thereto.

As described above, according to the exemplary embodiment of the present disclosure, the luminous efficiency can be increased by a micro cavity effect in which repetitive reflection occurs between the anode including the reflective laver and the cathodes 126_1 and 126_2 having transflective characteristics.

The capping layers CPL_1 and CPL_2 can be disposed above the cathodes 126_1 and 126_2. The capping layers CPL_1 and CPL_2 are configurations for increasing the light extraction effect in the light emitting diode and can be formed of any one of hole transporting layer HTL, red hole transporting layer HTL_R, green hole transporting layer HTL_G material, an electron transporting layer ETL material, and host materials of the red emission layer EML_R, the green emission layer EML_G, and the blue emission layer EML_B.

For example, even though in FIG. 8, it is illustrated that the capping layers CPL_1 and CPL_2 are configured by two layers of a first capping layer CPL_1 and a second capping layer CPL_2, the present disclosure is not limited thereto. Further, the capping layers CPL_1 and CPL_2 can be omitted.

In the meantime, according to the exemplary embodiment of the present disclosure, the P-doped hole transporting layer P-HTL can be disposed between the anode and the hole transporting layer HTL.

For example, the P-doped hole transporting layer P-HTL can be formed by doping the p-type dopant on the material which configures the hole transporting layer. In this case, in one process equipment, the P-doped hole transporting layer P-HTL and the hole transporting layer HTL can also be formed by a continuous process.

In the case of the bottom-emission type display device, the anode uses a transparent electrode and the cathode can use a reflective electrode. In this case, a deposition thickness for each of red, green, and blue sub pixels is similar by implementing a weak micro cavity effect and the entire thickness can be approximately 1300 to 2000 Å.

In contrast, in the case of the top emission type display device, the anode includes a reflective electrode and the cathode can use a transflective electrode. In this case, a deposition thickness for each of red, green, and blue sub pixels is different by implementing a strong micro cavity effect and the entire thickness can be approximately 2000 to 3000 Å.

In the case of the top emission type display device, in order to increase the hole transporting ability of the hole transporting layer HTL by the thickness increase, the P-doped hole transporting layer P-HTL can be added. Further, in order to protect the cathodes 126_1 and 126_2 and increase the light extraction effect, the capping layers CPL_1 and CPL_2 can be added.

Further, when a P-type dopant is added at a concentration of 3 to 5% or an N-type dopant at a concentration of 10 to 50% is added to the charge transporting layer, the injection and mobility of charges are increased, thereby improving luminous efficiency and driving voltage.

For low power consumption products, it is necessary to improve the driving voltage and efficiency of the top emission type display device and when the hole transporting layer P_HTL which is P-doped at a concentration of 3% is applied, for example, the driving voltage is reduced by approximately 1.0 V and the efficiency can be improved by approximately 9%.

The more the concentration of the P-type dopant to be added, the lower the driving voltage and the better the efficiency. However, there can be a leakage current problem. In contrast, when the concentration of the P-type dopant to be added is reduced, the leakage current is improved, but the lifetime of the blue light emitting diode is reduced and the driving voltage is increased. Further, the reliability can be lowered due to the pixel shrinkage phenomenon.

In the meantime, according to the present disclosure, the side-surface shaped anode and the convex spherical lens are used to improve the light extraction efficiency and the UV shielding layer is used to improve the pixel shrinkage phenomenon. Therefore, the P-dopant can be applied by less than 0.6%.

A lower end of the second UV shielding layer according to the present disclosure can extend toward the anode and this will be described in detail with reference to the following drawing.

Figure 9:
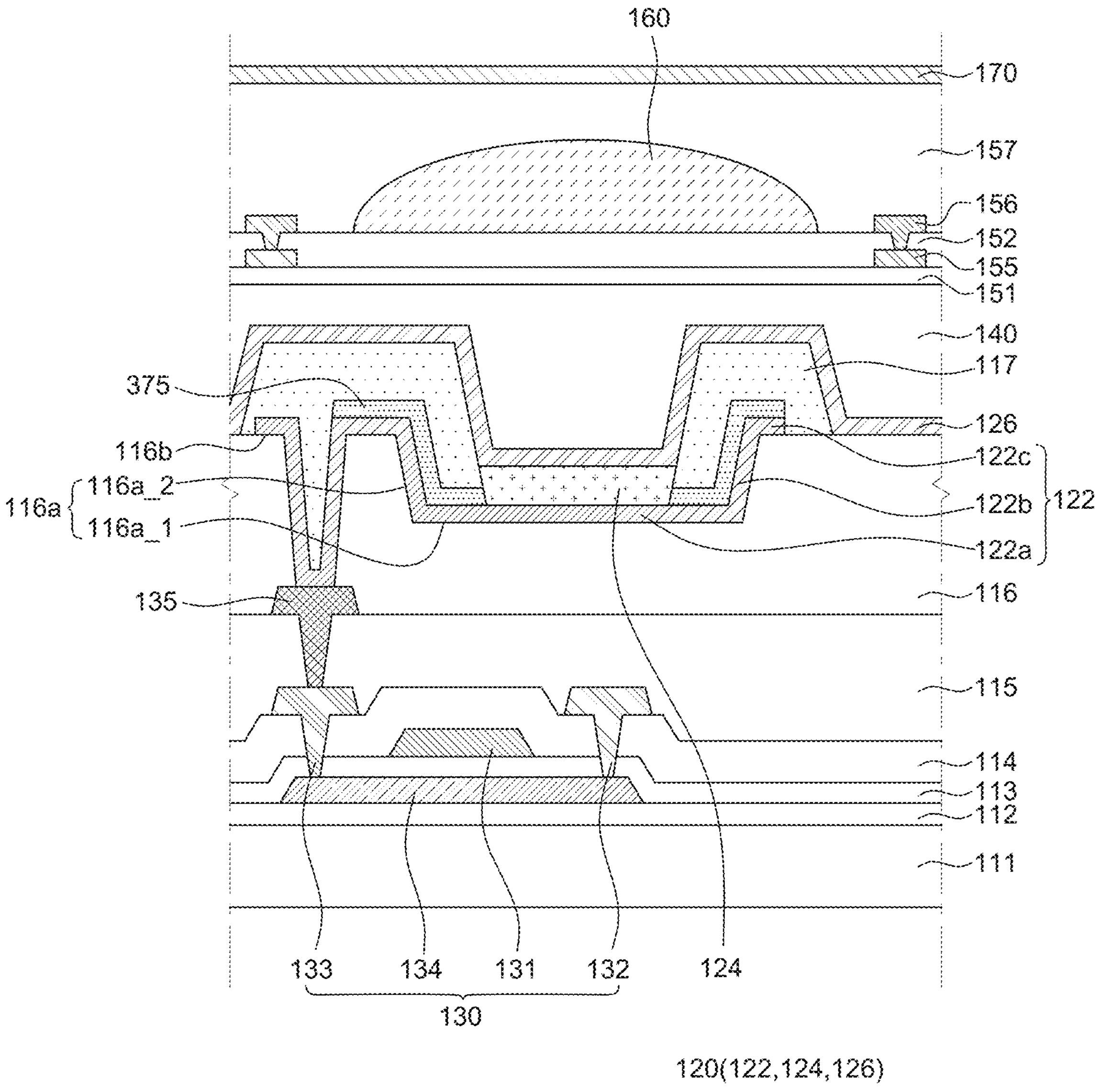
FIG. 9 is a view illustrating a part of a cross section of a display panel according to still another exemplary embodiment of the present disclosure.

FIG. 9 is a view illustrating a part of a cross section of a display panel according to still another exemplary embodiment of the present disclosure.

The display panel according to still another exemplary embodiment of the present disclosure of FIG. 9 has a second UV shielding layer 375 having a different shape from the above-described display panel according to another exemplary embodiment of the present disclosure of FIG. 5. However, the other configurations are substantially the same so that a redundant description will be omitted or may be briefly discussed.

For example, FIG. 9 illustrates a part of a cross-sectional structure of one sub pixel of a display panel according to still another exemplary embodiment of the present disclosure.

Referring to FIG. 9, in the same way as in another exemplary embodiment described above, a driving circuit including a light emitting diode 120 and a driving thin film transistor 130 can be disposed above the substrate 111.

According to still another exemplary embodiment of the present disclosure, a second UV shielding layer 375 can be disposed on a part of top surfaces of the first area 122*a* and the third area 122*c* of the anode 122 and a top surface of the second area 122*b*.

In FIG. 9, an example that the second UV shielding layer 375 is disposed on a part of the top surfaces of the first area 122*a* and the third area 122*c* of the anode 122 and the entire top surface of the second area 122*b* is illustrated, but the present disclosure is not limited thereto. The second UV shielding layer 375 can also be disposed on the entire top surface of the third area 122*c* of the anode 122 or disposed to cover the third area 122*c* of the anode 122. For example, the second UV shielding layer 375 can be in contact with the top surfaces of the first area 122*a*, the second area 122*b*, and the third area 122*c* of the anode 122, but the present disclosure is not limited thereto and another layer can also be interposed therebetween.

The second UV shielding layer 375 extends to the first area 122*a* of the anode 122 to be in contact with a side surface of the emission stack 124, but is not limited thereto. Further, for example, the second UV shielding layer 375 extends to the first area 122*a* and the emission stack 124 can also be disposed thereon so as to overlap the second UV shielding layer 375.

As described above, for example, the second UV shielding layer 375 can include triazine derivatives, salicylate derivatives, benzotriazole derivatives, benzophenone derivatives, hydroxyflavone derivatives, or xantone derivatives.

For example, the UV ray absorbing material included in the second UV shielding layer 375 can be one of materials of Formulae 1 to 7.

According to still another exemplary embodiment of the present disclosure, the second UV shielding layer 375 is applied to the top surfaces of the first area 122*a*, the second area 122*b*, and the third area 122*c* of the anode 122 to further effectively block the UV light which is (reversibly) reflected to the light emitting diode 120 by the side-mirror shaped anode 122.

The bank 117 can be disposed above the second planarization layer 116 and a part of the anode 122. Further, the bank 117 according to still another exemplary embodiment of the present disclosure can be disposed so as to cover the second UV shielding layer 375.

The bank 117 can include a first part and a second part. The first part is disposed on the second UV shielding layer 275 in an area corresponding to a part of the concave portion 116*a* provided in the second planarization layer 116. The second part is disposed above the anode 122, the second UV shielding layer 375, and the second planarization layer 116 in an area corresponding to the peripheral portion 116*b* of the second planarization layer 116.

For example, the bank 117 can also expose a part of the side surface of the second UV shielding layer 275 above the first area 122*a* of the anode 122, but is not limited thereto.

In the meantime, when the lens 160 is disposed above the encapsulation unit 140, the light path can be collected to the light emitting diode 120 and the UV light is reflected from the bank 117 to affect the light emitting diode 120. Therefore, the UV shielding layer can be formed in an outer peripheral area other than the active area, which will be described in detail with reference to the following drawings.

Figure 10:
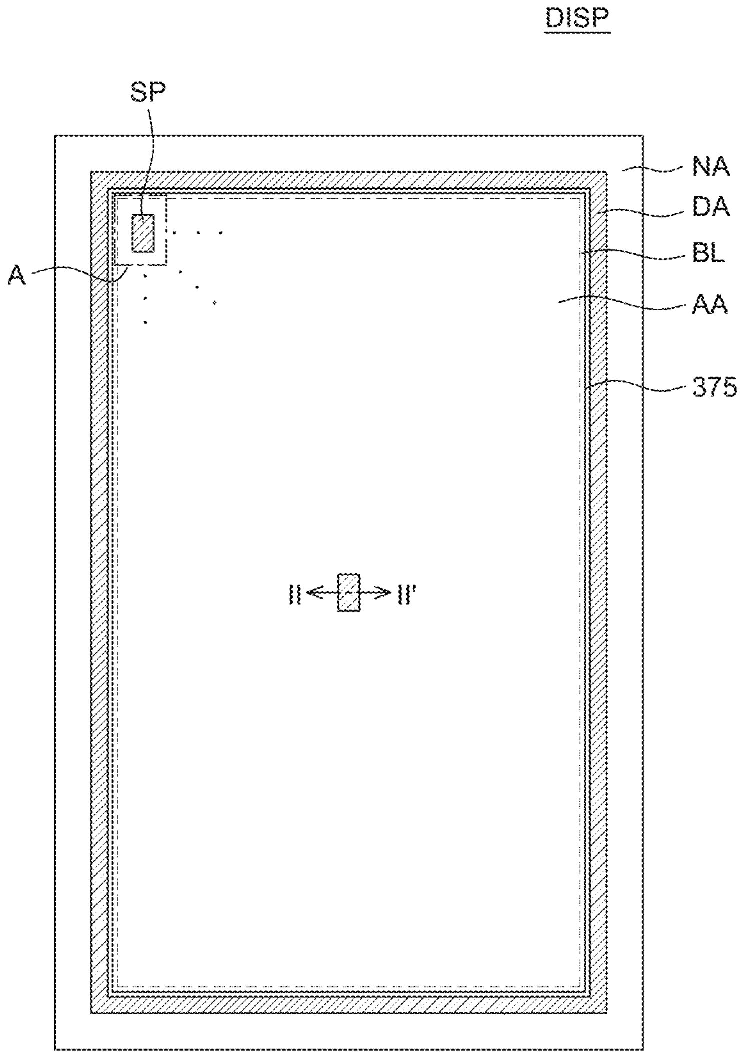
FIG. 10 is a view schematically illustrating a display panel according to still another exemplary embodiment of the present disclosure.

FIG. 10 is a view schematically illustrating a display panel according to still another exemplary embodiment of the present disclosure.

Figure 11:
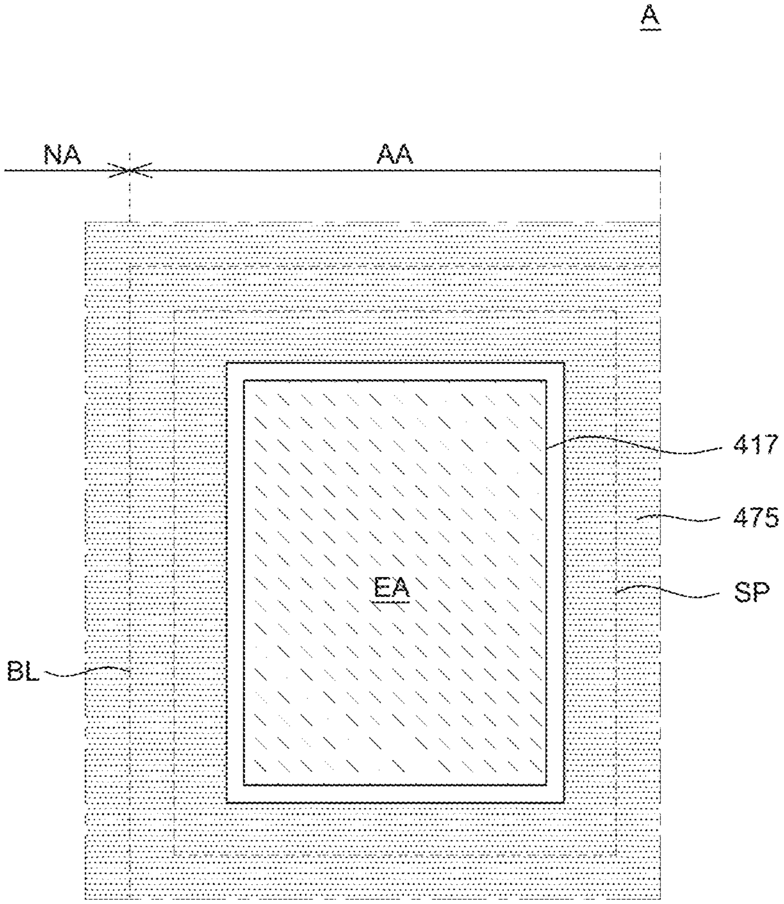
FIG. 11 is an enlarged view of a part A of FIG. 10.

FIG. 11 is a view of an enlarged part A of FIG. 10.

Figure 12:
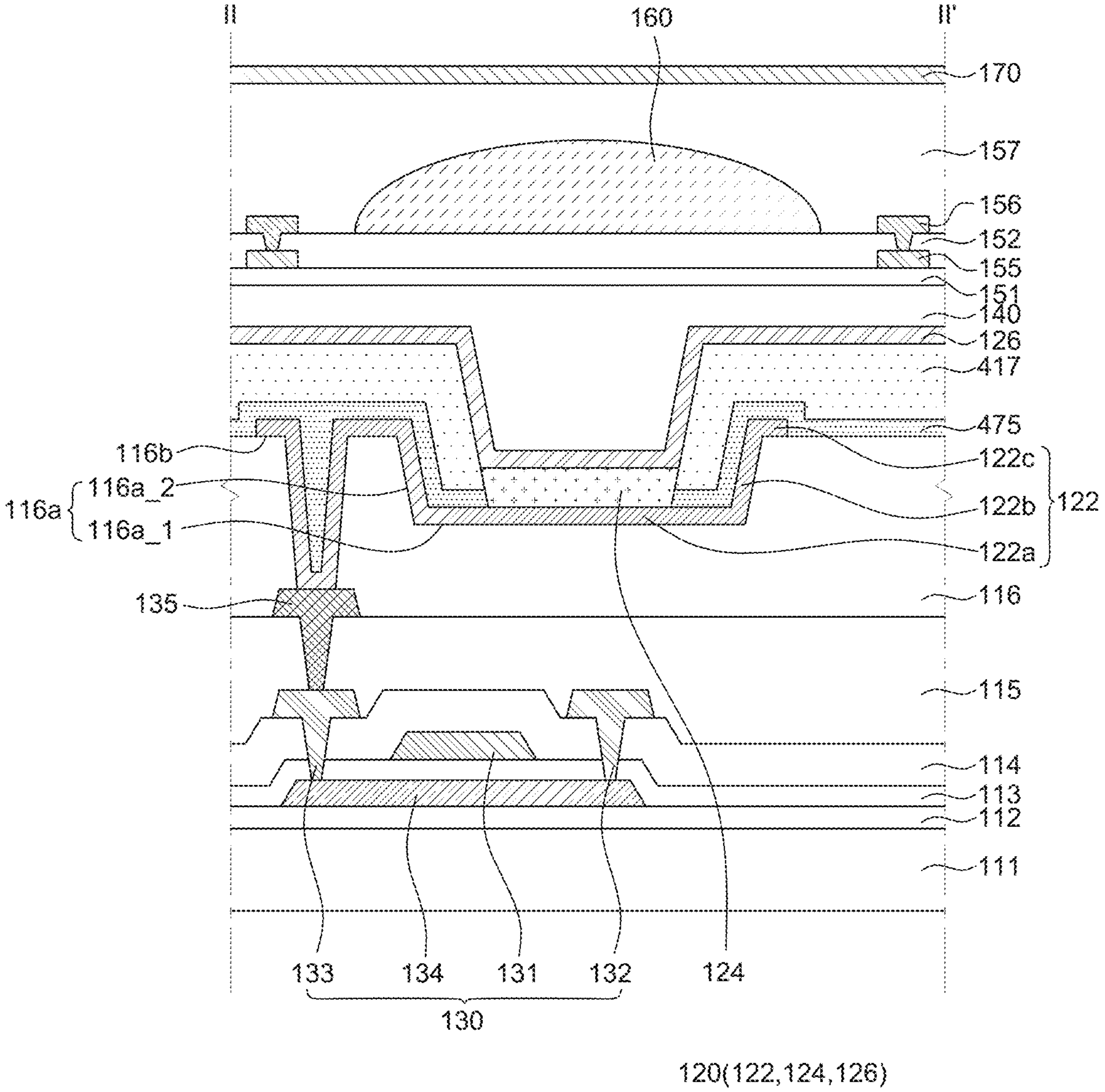
FIG. 12 is a cross-sectional view taken along line II-II' of FIG. 10.

FIG. 12 is a cross-sectional view taken along line II-II' of FIG. 10.

A display panel DISP according to still another exemplary embodiment of the present disclosure of FIGS. 10 to 12 has a second UV shielding layer 475 having a different configuration from the above-described display panel according to another exemplary embodiment of the present disclosure of FIG. 5. However, the other configurations are substantially the same so that a redundant description will be omitted or may be briefly provided.

Particularly, FIG. 11 illustrates a part of the display panel DISP at the upper left end including one sub pixel SP illustrated in FIG. 10.

FIG. 12 illustrates a part of a cross-sectional structure of one sub pixel SP of the display panel DISP according to still another exemplary embodiment of the present disclosure.

First, referring to FIGS. 10 and 11, the display panel DISP can include an active area AA in which images are displayed and a non-active area NA which is an outer area of an outer boundary line BL of the active area AA.

In the active area AA of the display panel DISP, a plurality of sub pixels SP for displaying images is disposed and various electrodes or signal lines for driving the display panel are disposed.

Further, the display panel DISP according to still another exemplary embodiment of the present disclosure can include a dam area DA having a dam for suppressing any layer (for example, the encapsulation unit in the display panel) in the active area AA from passing over the display panel DISP.

The dam area DA can be located at a boundary of the active area AA and the non-active area NA or at any one position of a non-active area NA which is an outer area of the active area AA.

The dam disposed in the dam area DA can be disposed to enclose all directions of the active area AA or disposed only at an outside of one or two or more parts of the active area AA.

The dam disposed in the dam area DA can also have one pattern in which all the dams are connected or two or more separated patterns. Further, in the dam area DA, only a primary dam can also be disposed or two dams (primary dam and secondary dam) can also be disposed, or three or more dams can also be disposed.

For example, in the dam area DA, in any one direction, only the primary dam is disposed and in the other direction, both the primary dam and the secondary dam can also be disposed.

In the meantime, according to still another exemplary embodiment of the present disclosure, the second UV shielding layer 475 can be disposed to extend to the outside of the active area AA. For example, the second UV shielding layer 475 can pass over the outer boundary line BL to extend to the non-active area NA. Further, for example, the second UV shielding layer 475 can pass over the outer boundary line BL to extend to the dam area DA. In this case, the problem in that the light emitting diode 120 is affected by the UV light which is reflected from the bank 417 can be suppressed.

Further, according to still another exemplary embodiment of the present disclosure, the second UV shielding layer 475 can also extend to an adjacent sub pixel SP. In this case, the second UV shielding layer 475 can also extend so as to cover the entire sub pixel SP excluding an emission area EA which is not blocked by the bank 417.

For example, referring to FIG. 12, a second UV shielding layer 475 can be disposed on a part of top surface of the first area 122*a* of the anode 122 and the entire top surfaces of the second area 122*b* and the third area 122*c*.

For example, the second UV shielding laver 475 can be disposed on the entire top surfaces of the second area 122*b* and the third area 122*c* excluding a part of top surface of the first area 122*a* of the anode 122 corresponding to the emission area EA.

For example, the second UV shielding layer 475 can be disposed so as to cover the second area 122*b* and the third area 122*c* of the anode 122.

For example, the second UV shielding layer 475 can also be in contact with the top surfaces of the first area 122*a*, the second area 122*b*, and the third area 122*c* of the anode 122, but the present disclosure is not limited thereto and another layer can be interposed therebetween.

For example, the second UV shielding layer 475 can also extend to the adjacent sub pixel SP. In this case, the second UV shielding layer 475 can also extend so as to cover the entire sub pixel SP excluding an emission area EA which is not blocked by the bank 417.

For example, the second UV shielding layer 475 can extend to the outside of the active area AA.

For example, the second UV shielding layer 475 can pass over the outer boundary line BL to extend to the non-active area NA. Further, for example, the second UV shielding layer 475 can also pass over the outer boundary line BL to extend to the dam area DA.

Figure 13A:
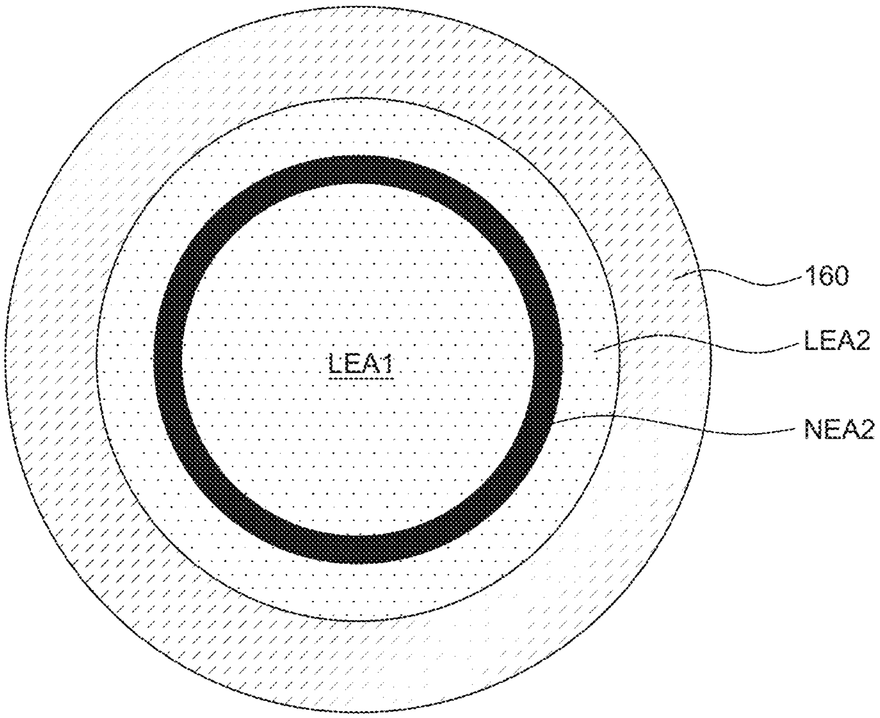
FIGS. 13A to 13C are views for explaining a planar features of a display device according to exemplary embodiments of the present disclosure.
Figure 13B:
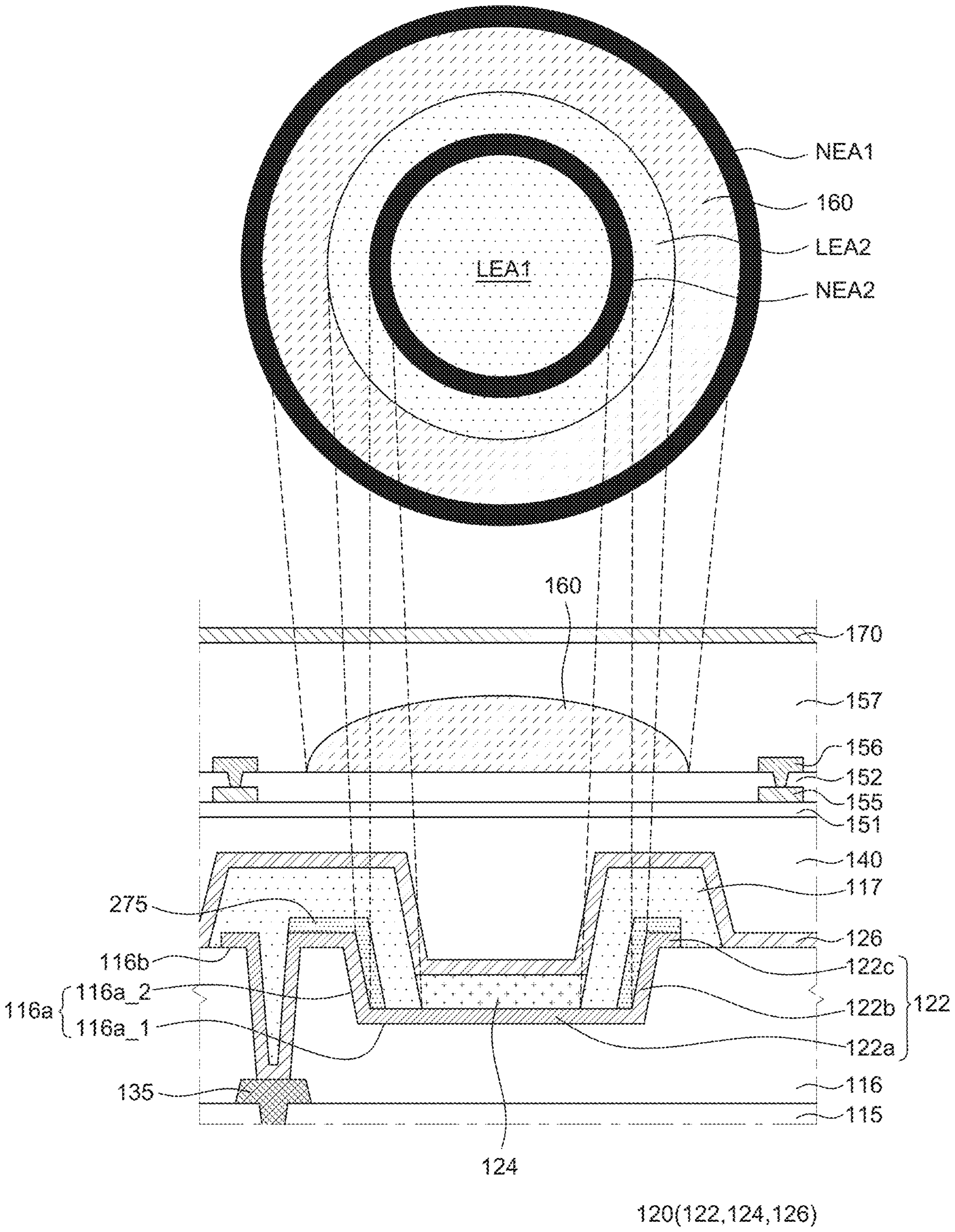
Figure 13C:
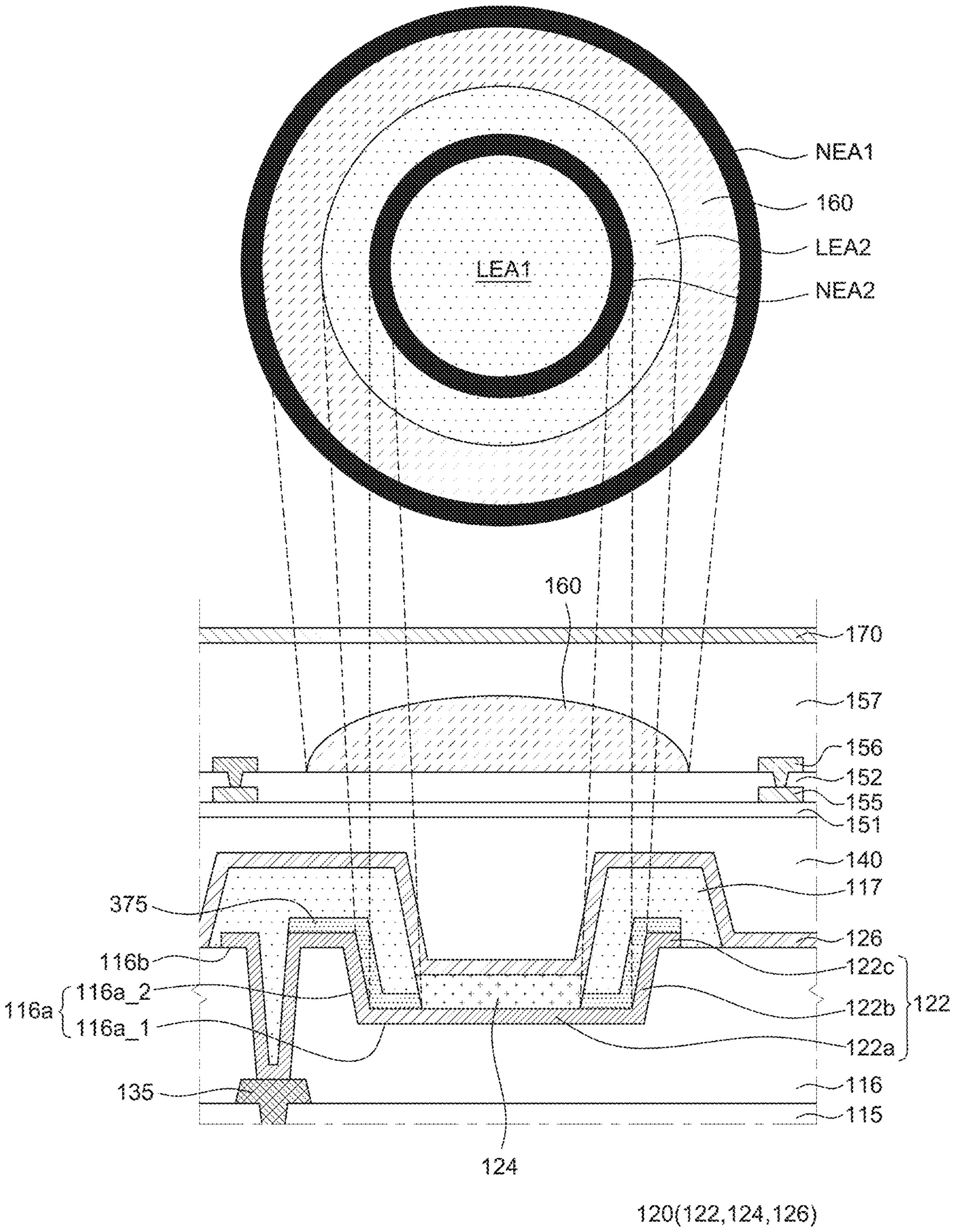

FIGS. 13A to 13C are views for explaining a part of a plane of a display device according to exemplary embodiments of the present disclosure.

FIG. 13A is a plan view illustrating an emission area of one sub pixel and a lens according to all the exemplary embodiments of the present disclosure.

Referring to FIG. 13A, there can be a main emission area LEA in which a light emitting diode corresponding to the first area of the anode which does not overlap the bank emits light and a reflective emission area LEA2 in which light emitted from the light emitting diode is reflected from the second area of the anode to be discharged. There can be a first non-emission area between the adjacent sub pixels, for example, between the reflective mission areas LEA2 of the adjacent sub pixels and a second non-emission area NEA2 between the main emission area LEA1 and the reflective emission area LEA2. The second non-emission area NEA2 is an area where a part of the first area of the anode disposed on a flat portion of the concave portion of the second planarization layer overlaps the bank.

The lens 160 can be disposed so as to overlap and sufficiently cover the emission areas LEA and LEA2 of one sub pixel. For example, the lens 160 can be divided into a center area overlapping the main emission area LEA1 and a peripheral area which encloses the center region. Even though in FIG. 13A, it is illustrated that each of the emission areas LEA1 and LEA2 and the lens 160 have a circular shape, it is not limited thereto.

FIG. 13B illustrates a part of a cross-section of the above-described display panel according to another exemplary embodiment of the present disclosure illustrated in FIG. 5 and is a plan view of the placement of the emission areas LEA1 and LEA2 for one sub pixel, the lens 160, and the second UV shielding layer 275.

Referring to FIG. 13B, the lens 160 is disposed so as to overlap and sufficiently cover the emission areas LEA1 and LEA2 of one sub pixel and can be spaced apart from the touch electrodes 156 so as not to interrupt the touch sensing.

An outer line of the second UV shielding layer 275 which is directed to the first non-emission area NEA1 can be disposed to overlap or pass over an outline of the lens 160. However, an inner line of the second UV shielding layer 275 may be disposed to pass over the second area 122*b* of the anode 122 and on the flat portion 116*a*_1 of the concave portion 116*a* of the second planarization layer 116 and can be disposed to overlap a part of the first area 122*a*. In the exemplary embodiment of FIG. 5, for example, the second UV shielding layer 275 may not overlap a part of the main emission area LEA1 and the second non-emission area NEA2. The second UV shielding layer 275 can overlap a surrounding area which encloses the center area.

FIG. 13C is a view illustrating a part of a cross section of the above-described display panel according to still another exemplary embodiment of the present disclosure illustrated in FIG. 9. The second UV shielding laver 375 has only a different configuration from that of another exemplary embodiment of the present disclosure described above and the other configurations are substantially the same so that a redundant description will be omitted.

Here, the inner line of the second UV shielding layer 375 can be disposed so as to cover an area of the first area 122*a* of the anode 122 overlapping the bank 117. In the exemplary embodiment of FIG. 9, for example, the second UV shielding layer 375 may not overlap only the main emission area LEA1. Further, for example, the second UV shielding layer 375 may not overlap only the center area of the lens 160.

According to still another exemplary embodiment of the present disclosure illustrated in FIG. 12 described above, in the active area of the substrate 111, the second UV shielding layer 475 can have an opening area so as not to overlap only the center area of the lens 160 of each sub pixel. For example, the second UV shielding layer 475 can overlap the reflective emission area LEA2, the first non-emission area NEAT, and the second non-emission area NEA2, excluding the main emission area LEA1.

Figure 14:
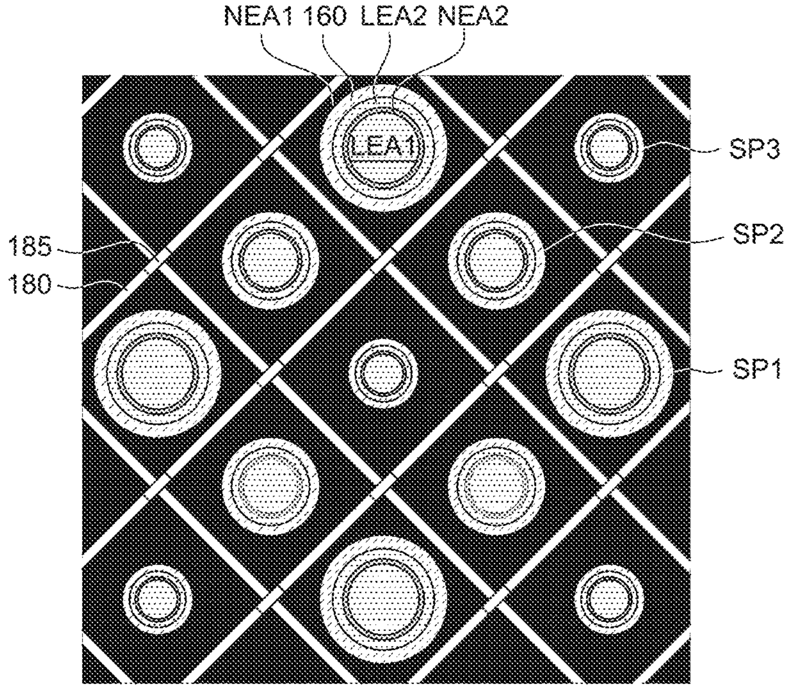
FIG. 14 is a view illustrating a planar feature by enlarging a part of FIG. 3.

FIG. 14 is a view illustrating a planar feature by enlarging a part of FIG. 3.

Particularly, FIG. 14 illustrates a placement of a plurality of sub pixels SP1, SP2, and SP3 and a mesh type touch electrode 180. The placement characteristic of the emission areas LEA1 and LEA2, the lens 160, and the second UV shielding layer in each of the sub pixels SP1, SP2, and SP3 is substantially the same as FIGS. 13A to 13C described above so that a redundant description will be omitted.

Referring to FIG. 14, the mesh type touch electrode 180 can be formed by an electrode metal which is patterned to be a mesh type. Accordingly, in the area of the mesh type touch electrode 180, there can be a plurality of opening areas and each opening area can correspond to emission areas LEA1 and LEA2 of one of sub pixels SP1, SP2, and SP3 in a red sub pixel, a green sub pixel, and a blue sub pixel. Alternatively, each opening area can correspond to the lens 160 or the second UV shielding layer disposed on one of sub pixels SP1, SP2, and SP3 in a red sub pixel, a green sub pixel, and a blue sub pixel.

In the meantime, a bridge configuration for connection between two touch electrodes 180 can include one or two or more bridge patterns 185.

In FIG. 14, it is illustrated that the plurality of sub pixels SP1, SP2, and SP3 has different sizes from each other, but is not limited thereto.

For example, the plurality of sub pixels SP1, SP2, SP3 can include a first sub pixel SP1, a second sub pixel SP2, and a third sub pixel SP3.

The first sub pixel SP1 can be any one of a red sub pixel, a green sub pixel, and a blue sub pixel, the second sub pixel SP2 can be another one of a red sub pixel, a green sub pixel, and a blue sub pixel, and the third sub pixel SP3 can be the remaining one of a red sub pixel, a green sub pixel, and a blue sub pixel.

As described above, in plan view, the emission areas LEA1 and LEA2 of one sub pixel SP1, SP2, or SP3, the lens 160, or the second UV shielding layer is present in each of opening areas of the touch electrode 180. Therefore, the touch sensing is possible and an aperture ratio and a luminous efficiency of the display panel are enhanced, and the damage of the light emitting diode due to the UV light can be suppressed.

The exemplary embodiments of the present disclosure can also be described as follows:

According to an aspect of the present disclosure, there is provided a display device. The display device comprises a substrate which is divided into a plurality of sub pixels each including an emission area, a planarization layer which is disposed above the substrate and has a concave portion including the emission area, an anode which includes the concave portion to be disposed on the planarization layer, a light emitting unit disposed on the anode of the emission area, a bank disposed above the anode and the planarization layer excluding the emission area, a cathode disposed on the light emitting unit and the planarization layer, an encapsulation unit disposed above the cathode, a lens which is disposed above the encapsulation unit corresponding to the emission area, a planarization layer disposed above the lens and a first light shielding layer disposed on the planarization layer.

The first light shielding layer can absorb and block ultraviolet rays.

The first light shielding layer can include benzophenone derivatives, xantone derivatives, triazine derivatives, salicylate derivatives, benzotriazole derivatives, or hydroxyflavone derivatives as material which do not emit light, but discharges heat when the ultraviolet rays are absorbed.

The planarization layer can further include a peripheral portion which encloses the concave portion and is located in the vicinity of the concave portion.

The concave portion can include a flat portion and an inclined portion which encloses the flat portion.

The anode can include a first area which is disposed on the planarization unit in an area overlapping the concave portion and a second area which extends from the first area to be disposed on the inclined portion in the area overlapping the concave portion.

The anode can further include a third area which extends from the second area to be disposed on the peripheral portion and the third area overlaps the peripheral portion.

The display device can further include a second light shielding layer disposed on top surfaces of the second area and the third area.

The second light shielding layer can be disposed on the entire top surface of the second area and a part of the top surface of the third area.

The second light shielding layer can be disposed on the entire top surface of the second area and the entire top surface of the third area.

The second light shielding layer can be in contact with the top surfaces of the second area and the third area.

The second light shielding layer can absorb and block ultraviolet rays, and can include benzophenone derivatives, xantone derivatives, triazine derivatives, salicylate derivatives, benzotriazole derivatives, or hydroxyflavone derivatives.

The bank can include a first part which is disposed on the anode and the second light shielding layer in an area corresponding to a part of the concave portion and a second part which is disposed above the anode, the second light shielding layer, and the planarization layer in an area corresponding to the peripheral portion.

The bank can be disposed so as to cover the second light shielding layer.

The substrate can include an active area and a non-active area and the second light shielding layer can be disposed to extend to the non-active area.

The non-active area can include a dam area in which a dam is disposed and the second light shielding layer extends to the dam area.

The second light shielding layer can extend to the adjacent sub pixel.

The second light shielding layer can extend so as to cover the entire sub pixel excluding the emission area.

The second light shielding layer can be disposed on a part of a top surface of the first area and the entire top surfaces of the second area and the third area.

The second light shielding layer can be disposed so as to cover the second area and the third area and the second light shielding layer can be in contact with the top surfaces of the first area, the second area, and the third area.

According to another aspect of the present disclosure, there is provided a display device. The display device comprises a substrate including an active area having a plurality of sub pixels and a non-active area, a thin film transistor disposed in the active area of the substrate, a light emitting diode which is disposed in the active area of the substrate to be electrically connected to the thin film transistor and has at least one emission area in one sub pixel and a lens which is disposed above the light emitting diode so as to overlap the at least one emission area, the lens can be configured by a center area which covers at least one emission area and a peripheral area which encloses the center area and can have a UV shielding layer disposed to overlap the peripheral area.

One sub pixel, among the plurality of sub pixels, can have a first emission area and a second emission area formed along an outline of the first emission area, the one sub pixel can be separated from another sub pixel by a first non-emission area and the first emission area and the second emission area can be separated by a second non-emission area, and the UV shielding layer can overlap at least one emission area and at least one of the first non-emission area and the second non-emission area.

The display device can further include an encapsulation layer disposed between the lens and the light emitting diode to encapsulate the light emitting diode and a touch electrode having an opening area so as to correspond to each sub pixel, the lens can be disposed in the opening area.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate divided into a plurality of sub pixels, each sub pixel including an emission area;

a planarization layer disposed on the substrate and including a concave portion having the emission area;

an anode including the concave portion to be disposed on the planarization layer;

a light emitting unit disposed on the anode of the emission area;

a bank disposed on the anode and the planarization layer excluding the emission area;

a cathode disposed on the light emitting unit and the planarization layer;

an encapsulation unit disposed on the cathode;

a lens disposed on the encapsulation unit corresponding to the emission area;

a planarization layer disposed on the lens; and a first light shielding layer disposed on the planarization layer, wherein the first light shielding layer is disposed to cover both the emission area and a non-emission area in one of the sub pixels.

2. The display device according to claim 1, wherein the first light shielding layer absorbs and blocks ultraviolet rays.

3. The display device according to claim 2, wherein the first light shielding layer includes benzophenone derivatives, xantone derivatives, triazine derivatives, salicylate derivatives, benzotriazole derivatives, or hydroxyflavone derivatives as material which do not emit light, but discharges heat when the ultraviolet rays are absorbed.

4. The display device according to claim 1, wherein the planarization layer further includes a peripheral portion enclosing the concave portion and located in a vicinity of the concave portion.

5. The display device according to claim 4, wherein the concave portion includes a flat portion and an inclined portion extending from the flat portion.

6. The display device according to claim 5, wherein the anode includes:

a first area disposed on the planarization layer in an area overlapping the concave portion; and a second area extending from the first area to be disposed on the inclined portion in the area overlapping the concave portion.

7. The display device according to claim 6, wherein the anode further includes a third area extending from the second area to be disposed on the peripheral portion of the planarization layer, and the third area overlaps the peripheral portion the planarization layer.

8. The display device according to claim 7, further comprising:

a second light shielding layer disposed on top surfaces of the second area and the third area.

9. The display device according to claim 8, wherein the second light shielding layer is disposed on the entire top surface of the second area and a part of the top surface of the third area, or wherein the second light shielding layer is disposed on the entire top surface of the second area and the entire top surface of the third area.

10. The display device according to claim 8, wherein the second light shielding layer is in contact with the top surfaces of the second area and the third area.

11. The display device according to claim 8, wherein the second light shielding layer absorbs and blocks ultraviolet rays, and includes benzophenone derivatives, xantone derivatives, triazine derivatives, salicylate derivatives, benzotriazole derivatives, or hydroxyflavone derivatives.

12. The display device according to claim 8, wherein the bank includes:

a first part disposed on the anode and the second light shielding layer in an area corresponding to a part of the concave portion; and a second part disposed on the anode, the second light shielding layer, and the planarization layer in an area corresponding to the peripheral portion.

13. The display device according to claim 8, wherein the bank is disposed so as to cover the second light shielding layer.

14. The display device according to claim 8, wherein the substrate includes an active area and a non-active area, and the second light shielding layer is disposed to extend to the non-active area.

15. The display device according to claim 14, wherein the non-active area includes a dam area having a dam, and the second light shielding layer extends to the dam area.

16. The display device according to claim 8, wherein the second light shielding layer extends to an adjacent sub pixel among the plurality of sub pixels.

17. The display device according to claim 8, wherein the second light shielding layer extends so as to cover an entire sub pixel excluding the emission area among the plurality of sub pixels.

18. The display device according to claim 8, wherein the second light shielding layer is disposed on a part of a top surface of the first area and the entire top surfaces of the second area and the third area.

19. The display device according to claim 18, wherein the second light shielding layer is disposed so as to cover the second area and the third area, and the second light shielding layer is in contact with the top surfaces of the first area, the second area, and the third area.

20. A display device, comprising:

a substrate including an active area having a plurality of sub pixels and a non-active area being adjacent to the active area;

a thin film transistor disposed in the active area of the substrate;

a light emitting diode disposed in the active area of the substrate to be electrically connected to the thin film transistor, the light emitting diode including at least one emission area in one sub pixel among the plurality of sub pixels;

a lens disposed on the light emitting diode so as to overlap the at least one emission area, wherein the lens includes a center area covering the at least one emission area and a peripheral area enclosing the center area, and wherein an ultraviolet (UV) shielding layer is disposed to overlap both the center area and the peripheral area.

21. The display device according to claim 20, wherein one sub pixel, among the plurality of sub pixels, has a first emission area and a second emission area disposed along an outline of the first emission area, wherein the one sub pixel is separated from another sub pixel by a first non-emission area, and wherein the first emission area and the second emission area are separated by a second non-emission area.

22. The display device according to claim 20, further comprising:

an encapsulation layer disposed between the lens and the light emitting diode to encapsulate the light emitting diode; and a touch electrode having an opening area so as to correspond to each sub pixel, wherein the lens is disposed in the opening area.

* * * * *